US012639040B2

(12) United States Patent
Aoki et al.

(10) Patent No.: US 12,639,040 B2
(45) Date of Patent: May 26, 2026

(54) SEMICONDUCTOR DEVICE INCLUDING PRODUCT-SUM OPERATION CIRCUIT AND MEMORY DEVICE, ELECTRONIC COMPONENT, AND ELECTRONIC DEVICE

(71) Applicant: SEMICONDUCTOR ENERGY LABORATORY CO., LTD., Atsugi (JP)

(72) Inventors: Takeshi Aoki, Ebina (JP); Yoshiyuki Kurokawa, Sagamihara (JP); Munehiro Kozuma, Atsugi (JP); Takuro Kanemura, Sapporo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1177 days.

(21) Appl. No.: 17/625,392

(22) PCT Filed: Jun. 29, 2020

(86) PCT No.: PCT/IB2020/056106
§ 371 (c)(1),
(2) Date: Jan. 7, 2022

(87) PCT Pub. No.: WO2021/009586
PCT Pub. Date: Jan. 21, 2021

(65) Prior Publication Data
US 2022/0276834 A1     Sep. 1, 2022

(30) Foreign Application Priority Data
Jul. 12, 2019     (JP) ................................ 2019-129927

(51) Int. Cl.
*G06F 7/544* (2006.01)
*G06F 15/78* (2006.01)
(Continued)

(52) U.S. Cl.
CPC ........ *G06F 7/5443* (2013.01); *G06F 15/7821* (2013.01); *G11C 11/40* (2013.01); *H10D 30/6755* (2025.01)

(58) Field of Classification Search
CPC .. G06N 3/06; G06N 3/063–065; G11C 11/40; G06F 7/5443; G06F 17/16; G06F 15/7821; G06G 7/16; H10D 30/6755
See application file for complete search history.

(56) References Cited

U.S. PATENT DOCUMENTS 7,219,085 B2     5/2007  Buck et al.
7,548,892 B2     6/2009  Buck et al.
(Continued)

FOREIGN PATENT DOCUMENTS

JP     04-368692 A     12/1992
JP     11-088142 A     3/1999
(Continued)

OTHER PUBLICATIONS

International Search Report (Application No. PCT/IB2020/056106) dated Sep. 24, 2020.
(Continued)

*Primary Examiner* — Matthew D Sandifer
(74) *Attorney, Agent, or Firm* — Fish & Richardson P.C.

(57)     ABSTRACT

A semiconductor device which can efficiently perform reading of a weight coefficient and a product-sum operation is provided. The semiconductor device includes a product-sum operation circuit and a memory device. The product-sum operation circuit is formed using transistors formed on a semiconductor substrate, and a memory cell of the memory device is formed using an OS transistor provided to be stacked above the semiconductor substrate. The semiconductor device includes a plurality of product-sum operation units where the product-sum operation circuit and the
(Continued)

memory cell of the memory device are electrically connected to each other. In each of the product-sum operation units, a weight coefficient stored in the memory cell can be read and a product-sum operation can be performed.

12 Claims, 21 Drawing Sheets

(51) Int. Cl.
| | |
|---|---|
| *G11C 11/40* | (2006.01) |
| *H10D 30/67* | (2025.01) |

(56) References Cited

U.S. PATENT DOCUMENTS

| | | | | |
|---|---|---|---|---|
| 8,508,967 | B2 | 8/2013 | Yamazaki et al. | |
| 8,614,916 | B2 | 12/2013 | Nagatsuka et al. | |
| 2017/0263291 | A1* | 9/2017 | Kurokawa | G06F 7/00 |
| 2017/0270405 | A1* | 9/2017 | Kurokawa | H10D 86/60 |
| 2017/0301376 | A1* | 10/2017 | Kurokawa | H10D 30/6755 |
| 2017/0317085 | A1* | 11/2017 | Kurokawa | G06V 40/1306 |
| 2018/0101359 | A1* | 4/2018 | Harada | G06N 3/04 |
| 2018/0136906 | A1* | 5/2018 | Kurokawa | G06F 7/00 |
| 2018/0181862 | A1* | 6/2018 | Ikeda | H10D 84/83 |
| 2020/0160158 | A1 | 5/2020 | Okamoto et al. | |

FOREIGN PATENT DOCUMENTS

| | | | | | |
|---|---|---|---|---|---|
| JP | 2005-182785 | A | 7/2005 | | |
| JP | 2012-256820 | A | 12/2012 | | |
| JP | 2015-165447 | A | 9/2015 | | |
| JP | 2017107558 | A | * | 6/2017 | ............... G11C 8/12 |
| JP | 2019-036280 | A | 3/2019 | | |
| JP | 2019-047006 | A | 3/2019 | | |
| WO | WO-2018/189620 | | 10/2018 | | |

OTHER PUBLICATIONS

Written Opinion (Application No. PCT/IB2020/056106) dated Sep. 24, 2020.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

Yamazaki.S et al., "Research, Development, and Application of Crystalline Oxide Semiconductor", SID Digest '12: SID International Symposium Digest of Technical Papers, Jun. 5, 2012, vol. 43, No. 1, pp. 183-186.

* cited by examiner

100

113

10

15

| X[1] | X[2] | X[3] |
|------|------|------|
| X[4] | X[5] | X[6] |
| X[7] | X[8] | X[9] |

Data signal X

| W[1] | W[2] | W[3] |
|------|------|------|
| W[4] | W[5] | W[6] |
| W[7] | W[8] | W[9] |

Data signal W $$B = X[1] \times W[1] + X[2] \times W[2] + \cdots + X[8] \times W[8] + X[9] \times W[9]$$

50

| P(1,1) | P(1,2) | ⋯⋯ | P(1,v−1) | P(1,v) | ⋯⋯ | P(1,q−1) | P(1,q) |
|--------|--------|------|-----------|--------|------|-----------|--------|
| P(2,1) | P(2,2) | | P(2,v−1) | P(2,v) | | P(2,q−1) | P(2,q) |
| ⋮ | | | | ⋮ | | | |
| P(u−1,1) | P(u−1,2) | | P(u−1,v−1) | P(u−1,v) | | | |
| P(u,1) | P(u,2) | ⋯⋯ | P(u,v−1) | P(u,v) | | | |
| ⋮ | | | | | | | ⋮ |
| P(p−1,1) | P(p−1,2) | | | | | P(p−1,q−1) | P(p−1,q) |
| P(p,1) | P(p,2) | | ⋯⋯ | | | P(p,q−1) | P(p,q) |

| F(1,1) | F(1,2) | ⋯⋯ | F(1,v−1) | F(1,v) |
|--------|--------|------|-----------|--------|
| F(2,1) | F(2,2) | | F(2,v−1) | F(2,v) |
| ⋮ | | | | ⋮ |
| F(u−1,1) | F(u−1,2) | | F(u−1,v−1) | F(u−1,v) |
| F(u,1) | F(u,2) | ⋯⋯ | F(u,v−1) | F(u,v) |

FIG. 10A
510C
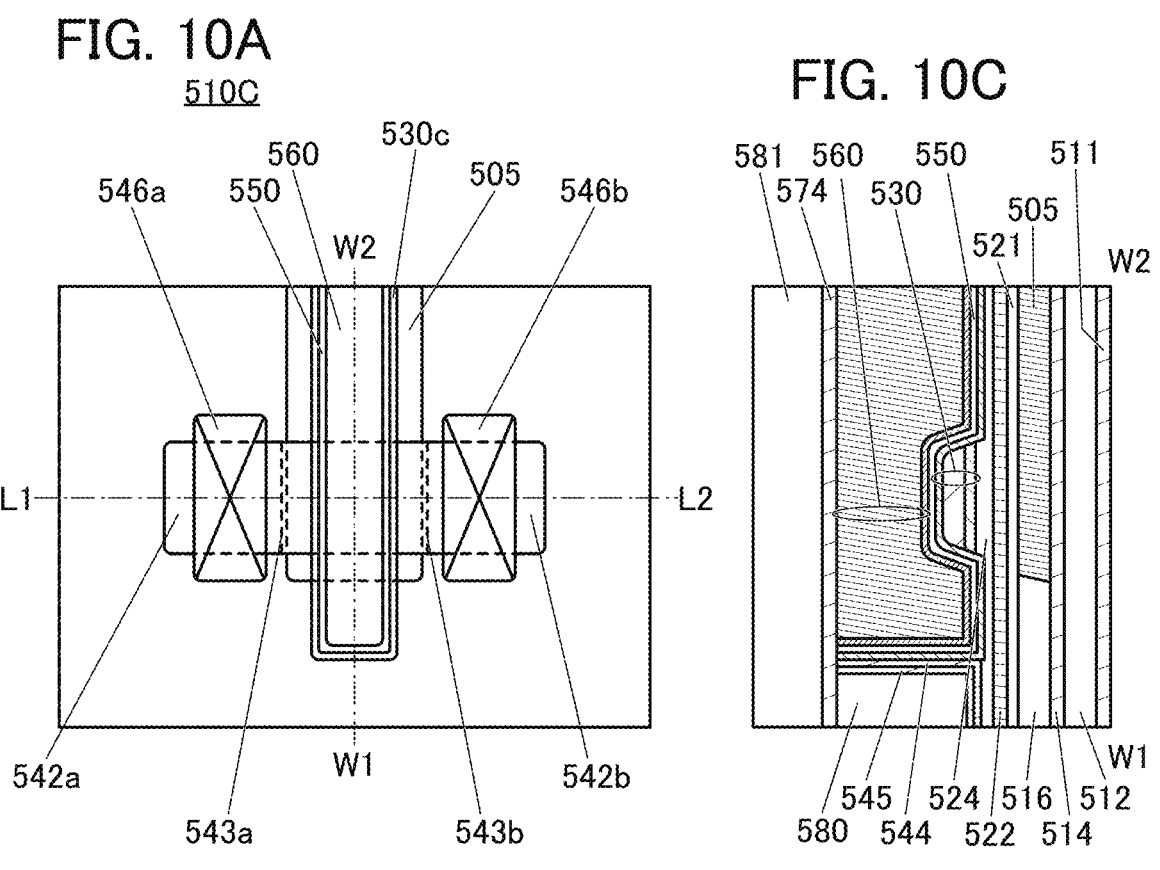
FIG. 10C
FIG. 10B
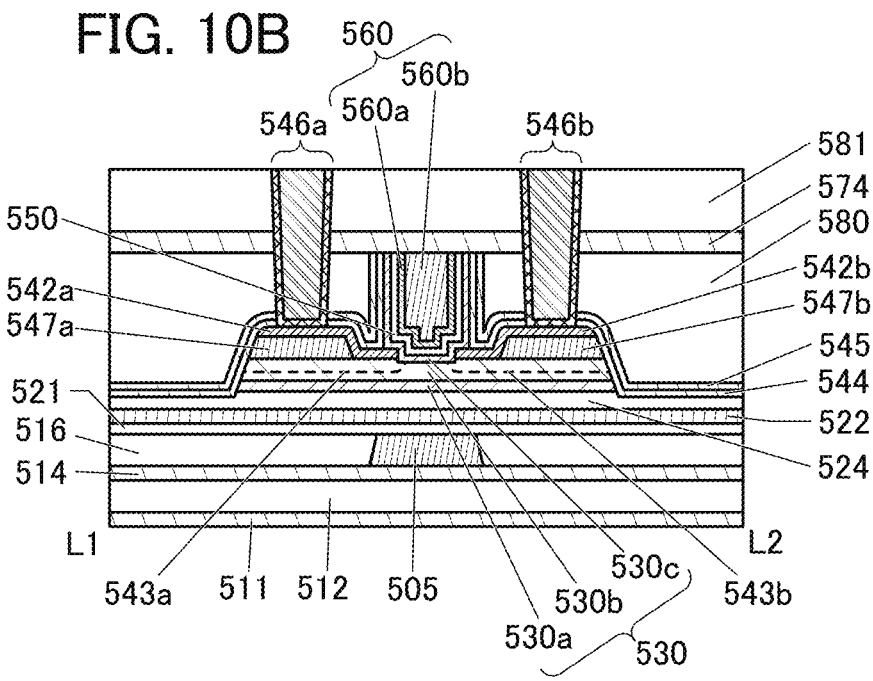

FIG. 11A
510D
546a  505  530c,550,560,570,571  546b
W2
L1 ——— L2
575  W1  530a,530b
FIG. 11C
582  571  552  530  505
584  574  560  550  512  514  W2
580  575  570  524  521  511
570  524  521  516  W1
522  516
FIG. 11B
560
560a  571  550
552  560b  570  575
531a  546a  546b
531b
584
582
580
531b
574
524
522
521
516
514
512
511
L1  L2
505  530a  530c
530b
530
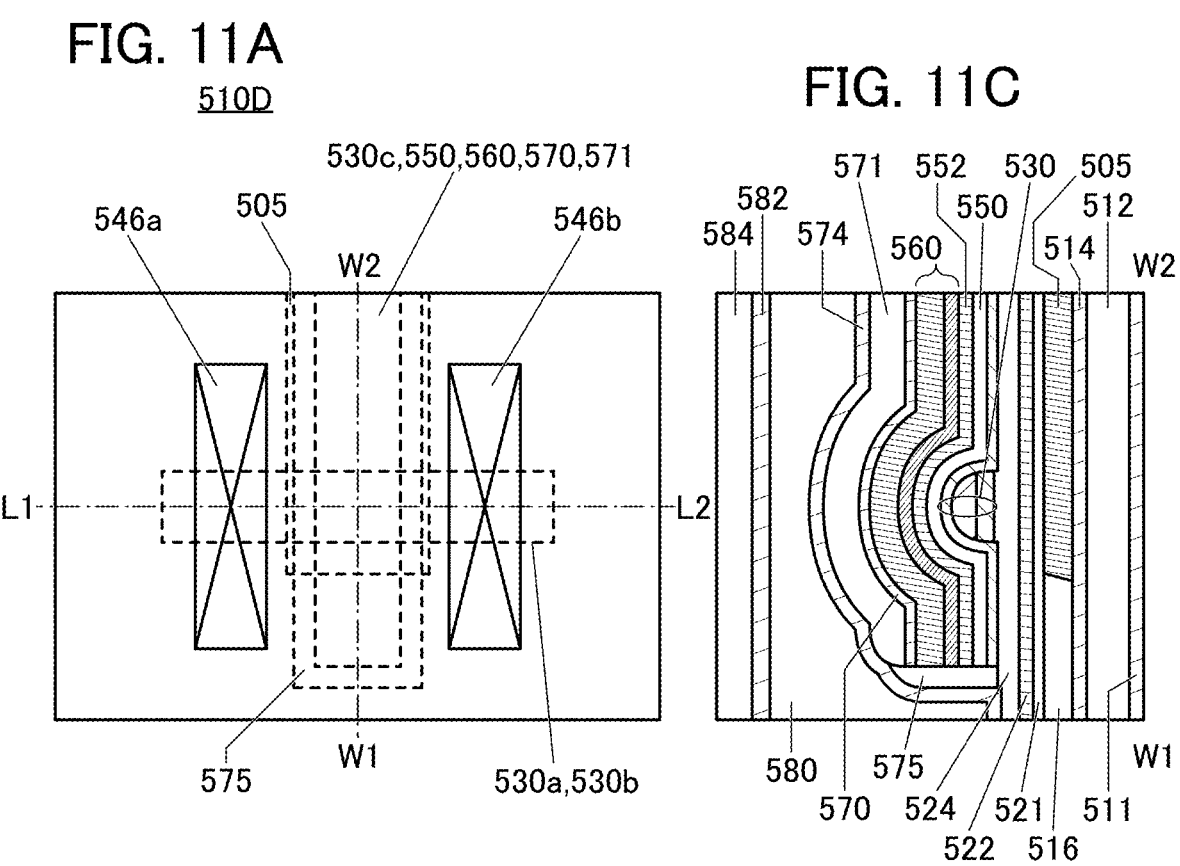
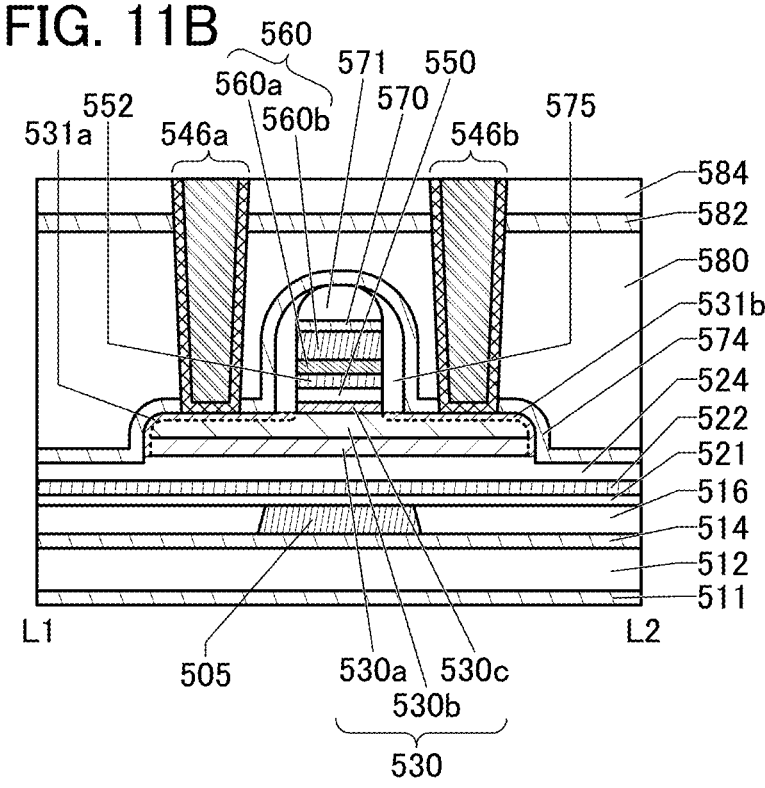

FIG. 12A
510E
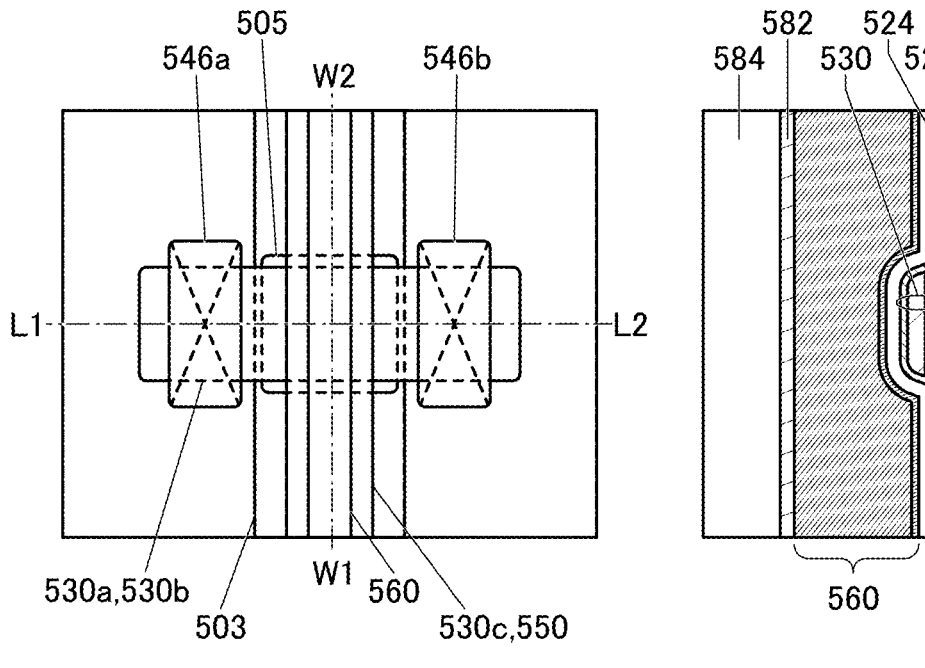
546a 505 546b
W2
L1 — — L2
530a,530b 503 W1 560 530c,550
FIG. 12C
582 524 521 514
584 530 522 516
W2
W1
560 503
505 511
FIG. 12B
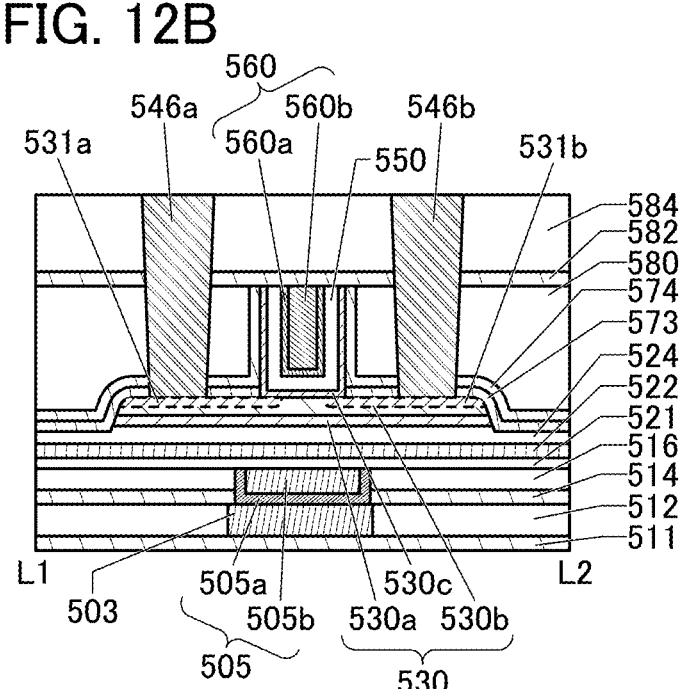
560
531a 546a 560b 546b 531b
560a 550
503 505a 530c
505b 530a 530b
505
530
584
582
580
574
573
524
522
521
516
514
512
511
L1 — L2

510F

510G

Intermediate state
New crystalline phase

| Amorphous | Crystalline | Crystal |
|---|---|---|
| ·completely amorphous | ·CAAC<br>·nc<br>·CAC | ·single crystal<br>·poly crystal |

Intensity [a.u.]

20　　30　　40　　50

$2\theta$ [deg.]

5nm⁻¹

713
Separation
region

711 Substrate

712
Circuit
region

714
Separation line

715 Chip

715 Chip

712 Circuit region

713 Separation region

Start

Back surface grinding   S721

Dicing   S722

Die bonding   S723

Wire bonding   S724

Sealing   S725

Lead plating   S726

Formation processing   S727

Marking   S728

Testing   S729

End

<u>1820</u>

1840

1841

1860

SEMICONDUCTOR DEVICE INCLUDING PRODUCT-SUM OPERATION CIRCUIT AND MEMORY DEVICE, ELECTRONIC COMPONENT, AND ELECTRONIC DEVICE

CROSS REFERENCE TO RELATED APPLICATIONS

This application is a U.S. National Phase Application under 35 U.S.C. § 371 of International Application PCT/IB2020/056106, filed on Jun. 29, 2020, which is incorporated by reference and claims the benefit of a foreign priority application filed in Japan on Jul. 12, 2019, as Application No. 2019-129927.

TECHNICAL FIELD

One embodiment of the present invention relates to a semiconductor device including a product-sum operation circuit and a memory device.

In this specification and the like, a semiconductor device refers to a device that utilizes semiconductor characteristics and indicates, for example, a circuit including a semiconductor element (a transistor, a diode, a photodiode, and the like), a device including the circuit, and the like. Note that in this specification and the like, a semiconductor device refers to any device that can function by utilizing semiconductor characteristics; examples of the semiconductor device include an integrated circuit, a chip provided with an integrated circuit, an electronic component in which a chip is incorporated in a package, and an electronic device provided with an integrated circuit.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

A product-sum operation is often used in calculations utilizing neural networks, for example. The neural network has a circuit configuration that resembles a biological neural network composed of neurons and synapses. Two or more pieces of data are input to each of the neurons and multiplied by a "weight coefficient", which represents the strength of connection, and the multiplication results are added. When the product-sum operation result obtained in this manner exceeds a threshold, the neuron outputs a high-level signal; this phenomenon is called "firing".

Computers with higher performance than the information processing that utilizes conventional von Neumann computers are expected to be obtained with the use of the neural network, which is an information processing system modeled on a biological neural network, and in recent years, a variety of researches for building neural networks have been carried out.

The neural network is utilized in the field of image recognition, for example. For image recognition, a convolutional operation for detecting features of image data is performed, in which image data is multiplied by parameters of a filter and summation is performed, and then the filter is shifted and the same operation is repeated. The convolutional operation is performed a plurality of times: the edge or the like of an image is detected in early convolutional operations; and more complicated features such as the shape and pattern of the image are detected in later convolutional operations.

Patent Document 1 discloses an example in which machine learning through a neural network is performed with the use of a processor such as a CPU (Central Processing Unit) or a GPU (Graphics Processing Unit) and hand-written character recognition is performed.

In recent years, a transistor including an oxide semiconductor or a metal oxide in a channel formation region (also referred to as an oxide semiconductor (OS) transistor) has attracted attention. The drain current of the OS transistor in an off state (such a current is also referred to as an off-state current) is extremely low (e.g., see Non-Patent Documents 1 and 2); thus, when the OS transistor is used in a memory cell of a DRAM, electric charge accumulated in a capacitive element can be retained for a long time.

Patent Document 2 discloses a semiconductor device including a plurality of memory cells each using an OS transistor over a semiconductor substrate where peripheral circuits such as a driver circuit and a control circuit are formed, and an example in which an OS transistor is used in a memory cell of a DRAM (Dynamic Random Access Memory). For example, when a peripheral circuit is formed using a Si transistor formed on a single crystal silicon substrate and a memory cell using an OS transistor is stacked thereabove, the chip area can be reduced.

A CAAC (c-axis aligned crystalline) structure and an nc (nanocrystalline) structure, which are neither single crystal nor amorphous, have been found in an oxide semiconductor (see Non-Patent Document 1 and Non-Patent Document 3). Non-Patent Document 1 and Non-Patent Document 3 disclose a technique for manufacturing a transistor using an oxide semiconductor having a CAAC structure.

REFERENCE

Patent Document

[Patent Document 1] Japanese Published Patent Application No. 2005-182785

[Patent Document 2] Japanese Published Patent Application No. 2012-256820

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).

[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

[Non-Patent Document 3] S. Yamazaki et al., "SID Symposium Digest of Technical Papers", 2012, volume 43, issue 1, p. 183-186

SUMMARY OF THE INVENTION

Problems to be Solved by the Invention

Image data and parameters of a filter for image recognition correspond to a plurality of pieces of data input to a neuron and a weight coefficient, respectively, in a neural network. In a convolutional operation for image recognition, product-sum operations are performed.

The weight coefficient is generated by learning, for example. The weight coefficient that has finished learning is repeatedly used for a plurality of pieces of data input to the neuron. Thus, higher speed and more efficient processing are required in reading of the weight coefficient to the product-sum operation circuit than in writing of the weight coefficient to a memory device.

An object of one embodiment of the present invention is to provide a semiconductor device which includes a product-sum operation circuit and a memory device and can efficiently perform reading of a weight coefficient and a product-sum operation. Another object of one embodiment of the present invention is to provide a semiconductor device which includes a product-sum operation circuit and a memory device and has a reduced chip area.

Note that one embodiment of the present invention does not necessarily achieve all the above-described objects and only needs to achieve at least one of the objects. The descriptions of the above-described objects do not preclude the existence of other objects. Objects other than these will be apparent from the descriptions of the specification, the claims, the drawings, and the like, and objects other than these can be derived from the descriptions of the specification, the claims, the drawings, and the like.

Means for Solving the Problems

One embodiment of the present invention is a semiconductor device including a plurality of product-sum operation units. The product-sum operation units include a first circuit and a memory cell. The first circuit includes a first transistor formed on a semiconductor substrate, and the memory cell includes a second transistor including a metal oxide in a channel formation region. The second transistor is formed to be stacked above the first transistor, and the first circuit has a function of reading data stored in the memory cell and a function of performing a product-sum operation.

One embodiment of the present invention is a semiconductor device including a word line driver circuit, a bit line driver circuit, and a product-sum operation block. The product-sum operation block includes a plurality of product-sum operation units, and the product-sum operation units include a first circuit and a memory cell. The first circuit includes a first transistor formed on a semiconductor substrate, and the memory cell includes a second transistor including a metal oxide in a channel formation region. The second transistor is formed to be stacked above the first transistor, the word line driver circuit and the bit line driver circuit have a function of writing data to the memory cell, and the first circuit has a function of reading data stored in the memory cell and a function of performing a product-sum operation.

One embodiment of the present invention is a semiconductor device including a word line driver circuit, a bit line driver circuit, and a product-sum operation block. The product-sum operation block includes a plurality of product-sum operation units, and the product-sum operation units include a first circuit and a memory cell. The word line driver circuit, the bit line driver circuit, and the first circuit each include a first transistor formed on a semiconductor substrate, and the memory cell includes a second transistor including a metal oxide in a channel formation region. The second transistor is formed to be stacked above the first transistor, the word line driver circuit and the bit line driver circuit have a function of writing data to the memory cell, and the first circuit has a function of reading data stored in the memory cell and a function of performing a product-sum operation.

Furthermore, in the above-described embodiments, the metal oxide contains at least one of In and Zn.

Effect of the Invention

With one embodiment of the present invention, a semiconductor device which includes a product-sum operation circuit and a memory device and can efficiently perform reading of a weight coefficient and a product-sum operation can be provided. With one embodiment of the present invention, a semiconductor device which includes a product-sum operation circuit and a memory device and has a reduced chip area can be provided.

Note that one embodiment of the present invention does not necessarily achieve all the above-described objects and only needs to achieve at least one of the objects. The descriptions of the above-described objects do not preclude the existence of other objects. Objects other than these will be apparent from the descriptions of the specification, the claims, the drawings, and the like, and objects other than these can be derived from the descriptions of the specification, the claims, the drawings, and the like.

BRIEF DESCRIPTION OF THE DRAWINGS

FIG. 9A is a top view illustrating a structure example of a transistor. FIG. 9B and FIG. 9C are cross-sectional views illustrating the structure example of the transistor.

FIG. 10A is a top view illustrating a structure example of a transistor. FIG. 10B and FIG. 10C are cross-sectional views illustrating the structure example of the transistor.

FIG. 11A is a top view illustrating a structure example of a transistor. FIG. 11B and FIG. 11C are cross-sectional views illustrating the structure example of the transistor.

FIG. 12A is a top view illustrating a structure example of a transistor. FIG. 12B and FIG. 12C are cross-sectional views illustrating the structure example of the transistor.

MODE FOR CARRYING OUT THE INVENTION

Figure 1:
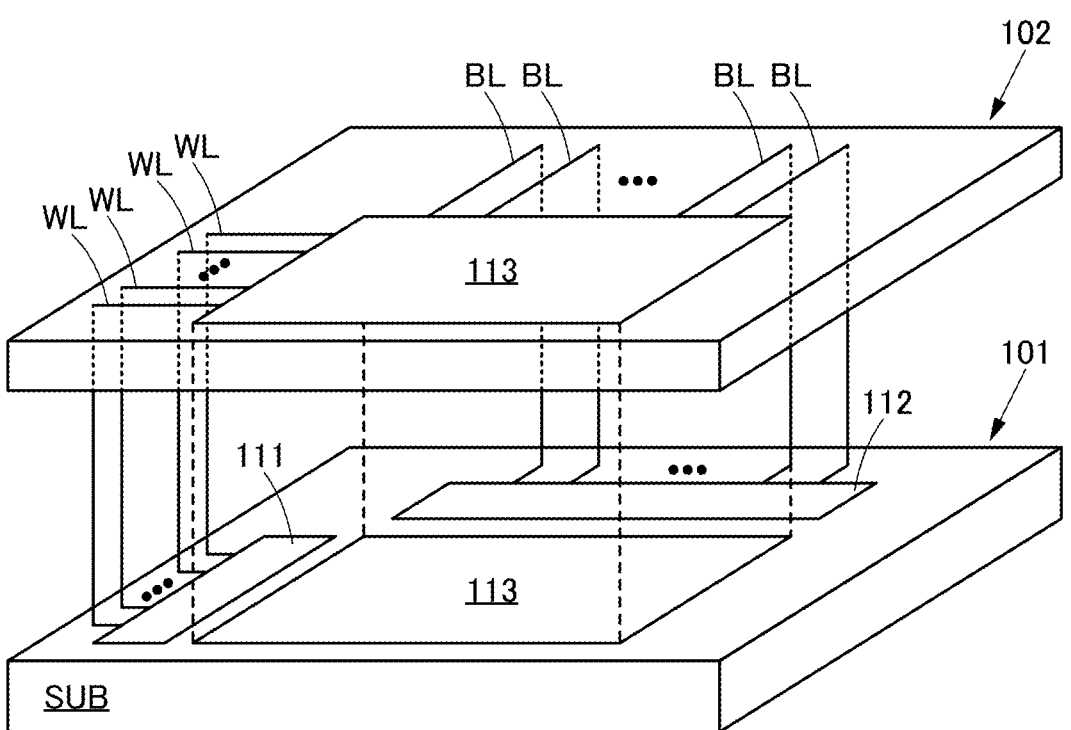
FIG. 1 is a schematic perspective view illustrating a structure example of a semiconductor device.

Embodiments will be described below with reference to the drawings. However, the embodiments can be implemented in many different modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to completely separate actual components according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, when a plurality of components are denoted by the same reference signs, and in particular need to be distinguished from each other, an identification sign such as "_1", "_2", "[n]", or "[m, n]" is sometimes added to the reference signs. For example, the second wiring GL is referred to as a wiring GL[2].

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitive element, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the term "electrode" or "wiring" does not functionally limit these components. For example, an "electrode" is used as part of a "wiring" in some cases, and vice versa.

In this specification and the like, a "terminal" in an electric circuit refers to a portion where a current or a potential is input (or output) or a signal is received (or transmitted). Accordingly, part of a wiring or an electrode functions as a terminal in some cases.

In general, a "capacitive element" has a structure in which two electrodes face each other with an insulator (dielectric) therebetween. Furthermore, in this specification and the like, cases where a "capacitive element" is one having a structure in which two electrodes face each other with an insulator therebetween, one having a structure in which two wirings face each other with an insulator therebetween, or one in which two wirings are positioned with an insulator therebetween, are included. In this specification and the like, a "capacitive element" is referred to as a "condenser" or a "capacitor" in some cases.

In this specification and the like, a "voltage" often refers to a potential difference between a given potential and a reference potential (e.g., a ground potential). Thus, a voltage and a potential difference can be interchanged with each other.

In this specification and the like, a transistor is an element having at least three terminals of a source, a drain, and a gate. Further, a channel formation region is included between the source (a source terminal, a source region, or a source electrode) and the drain (a drain terminal, a drain region, or a drain electrode), and a current can flow between the source and the drain through the channel formation region. Note that in this specification and the like, a channel formation region refers to a region through which a current mainly flows.

Furthermore, functions of a source and a drain might be switched when a transistor of opposite polarity is employed or the direction of current flow is changed in circuit operation, for example. Thus, the terms of a source and a drain are interchangeable in this specification and the like.

Furthermore, unless otherwise specified, an off-state current in this specification and the like refers to a drain current of a transistor in an off state (also referred to as a non-conduction state or a cutoff state). Unless otherwise specified, the off state of an n-channel transistor refers to a state where the voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an re-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when a transistor is in the off state. In addition, a leakage current sometimes expresses the same meaning as the off-state current. Furthermore, in this specification and the like, the off-state current sometimes refers to a current that flows between a source and a drain when a transistor is in the off state.

Furthermore, in this specification and the like, an on-state current sometimes refers to a current that flows between a source and a drain when a transistor is in the on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is referred to as an oxide semiconductor in some cases. That is to say, in the case where a metal oxide has at least one of an amplifying function, a rectifying function, and a switching function, the metal oxide can be referred to as a metal oxide semiconductor. In other words, a transistor including a metal oxide in a channel formation region can be referred to as an "oxide semiconductor transistor" or an "OS transistor". Similarly, a "transistor using an oxide semiconductor" is also a transistor including a metal oxide in a channel formation region.

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, a structure example and an operation example of a semiconductor device of one embodiment of the present invention are described. The semiconductor device of one embodiment of the present invention includes a product-sum operation circuit and a memory device. The semiconductor device of one embodiment of the present invention has a structure in which a layer including an OS transistor is provided to be stacked above a layer including transistors formed on a semiconductor substrate. The OS transistor has a characteristic of an extremely low off-state current.

<Schematic Perspective View of Semiconductor Device>

FIG. 1 is a schematic perspective view illustrating a structure example of a semiconductor device 100 of one embodiment of the present invention. The semiconductor device 100 illustrated in FIG. 1 includes a layer 101 and a layer 102 and has a structure in which the layer 102 is provided to be stacked above the layer 101. A circuit that can function by utilizing semiconductor characteristics is provided in each of the layer 101 and the layer 102. Note that in the drawings described in this specification and the like, the flow of main signals is indicated by an arrow or a line, and a power supply line and the like are omitted in some cases.

The semiconductor device 100 includes a word line driver circuit 111, a bit line driver circuit 112, and a product-sum operation block 113. The word line driver circuit 111 and the bit line driver circuit 112 are provided in the layer 101, and the product-sum operation block 113 is provided to extend across the layer 101 and the layer 102.

The word line driver circuit 111 and the bit line driver circuit 112 are formed using transistors formed on a semiconductor substrate SUB. There is no particular limitation on the semiconductor substrate SUB as long as channel regions of the transistors can be formed therein. For example, a single crystal silicon substrate, a single crystal germanium substrate, a compound semiconductor substrate (such as a SiC substrate or a GaN substrate), an SOI (Silicon on Insulator) substrate, or the like can be used.

As the SOI substrate, the following substrate may be used for example: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing; or an SOI substrate formed by using a method such as an ELTRAN method (a registered trademark: Epitaxial Layer Transfer) or a Smart-Cut method in which a semiconductor substrate is cleaved by utilizing growth of a minute void, which is formed by implantation of a hydrogen ion, by thermal treatment. A transistor formed using a single crystal substrate includes a single crystal semiconductor in a channel formation region.

The product-sum operation block 113 is formed using a transistor formed on the semiconductor substrate SUB and an OS transistor. Since the OS transistor can be formed by a method such as a thin-film method, the OS transistor can be provided to be stacked over the semiconductor substrate SUB. In other words, in the layer 101, the circuits are formed using the transistors formed on the semiconductor substrate SUB; while in the layer 102, the circuit is formed using the OS transistor.

Note that in this embodiment, an example in which a single crystal silicon substrate is used as the semiconductor single crystal silicon substrate SUB is described. A transistor formed on a single crystal silicon substrate is referred to as a Si transistor. A circuit formed using Si transistors can operate at high speed.

In the case where the product-sum operation block 113 is formed using a Si transistor and an OS transistor, the chip area of the semiconductor device 100 can be smaller (the size of the semiconductor device 100 can be smaller) than that in the case where the product-sum operation block 113 is formed using only Si transistors. Furthermore, the OS transistor can be manufactured with a manufacturing apparatus similar to that for a Si transistor and thus can be manufactured at low cost.

Here, an oxide semiconductor has a bandgap of 2.5 eV or larger, preferably 3.0 eV or larger; thus, an OS transistor has a low leakage current due to thermal excitation and also has characteristics of an extremely low off-state current. Note that the off-state current refers to a current that flows between a source and a drain when the transistor is in an off state.

A metal oxide used in a channel formation region of the OS transistor is preferably an oxide semiconductor containing at least one of indium (In) and zinc (Zn). Typical examples of such an oxide semiconductor include an In-M-

Zn oxide (an element M is one or more selected from Al, Ga, Y, or Sn, for example). Reducing impurities serving as electron donors, such as moisture or hydrogen, and oxygen vacancies can make the oxide semiconductor i-type (intrinsic) or substantially i-type. Such an oxide semiconductor can be referred to as a highly purified oxide semiconductor. Note that the details of the OS transistor are described in Embodiment 2 and Embodiment 3.

As illustrated in FIG. 1, the word line driver circuit 111 provided in the layer 101 is electrically connected to a part of the product-sum operation block 113 provided in the layer 102 by wirings WL. Similarly, the bit line driver circuit 112 provided in the layer 101 is electrically connected to a part of the product-sum operation block 113 provided in the layer 102 by wirings BL.

Although an example in which the word line driver circuit 111 and the bit line driver circuit 112 are formed using Si transistors has been described in this embodiment, they may be formed using OS transistors.

<Structure Example of Product-Sum Operation Block>

Figure 2A:
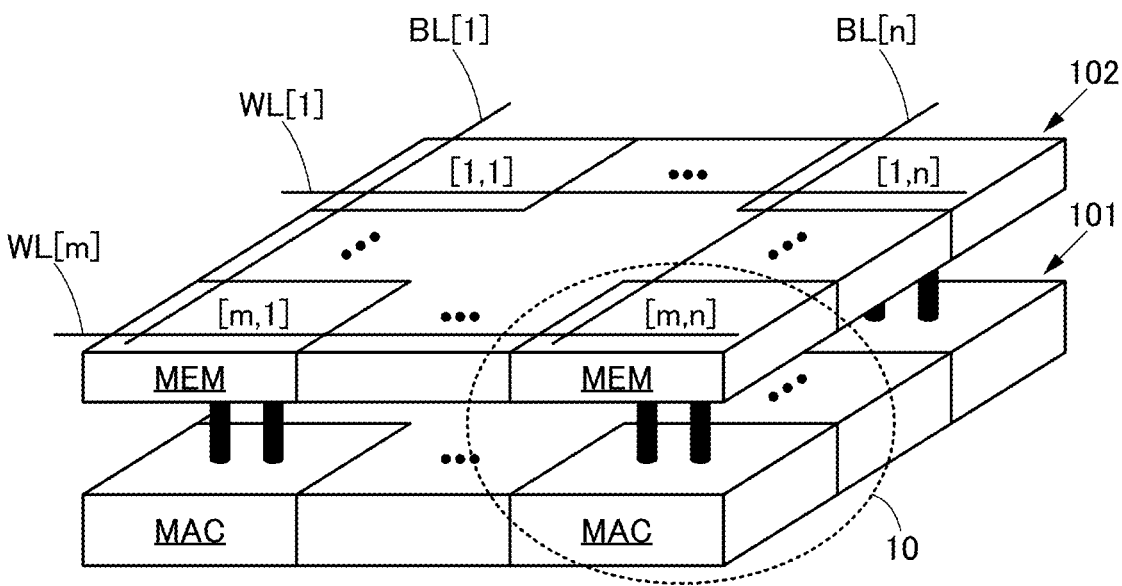
FIG. 2A is a schematic perspective view illustrating a structure example of a product-sum operation block.

FIG. 2A is a schematic perspective view illustrating a structure example of the product-sum operation block 113. The product-sum operation block 113 includes m×n product-sum operation units 10, the wirings WL, and the wirings BL (m and n are integers greater than or equal to 1).

As illustrated in FIG. 2A, a matrix of the product-sum operation units 10 with m rows and n columns is provided; [1, 1], [m, 1], [1, n], and [m, n] in FIG. 2A represent the addresses of the product-sum operation units 10. Each of the product-sum operation units 10 is electrically connected to the wiring WL and the wiring BL.

Furthermore, the product-sum operation units 10 are provided to extend across the layer 101 and the layer 102. A part of the product-sum operation unit 10 provided in the layer 102 is referred to as a circuit MEM, and a part of the product-sum operation unit 10 provided in the layer 101 is referred to as a circuit MAC.

Figure 2B:
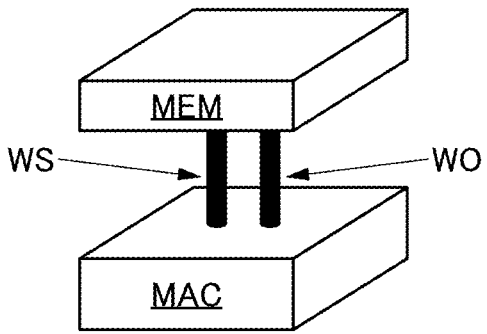
FIG. 2B is a schematic perspective view illustrating a structure example of a product-sum operation unit.

FIG. 2B is a schematic perspective view illustrating a structure example of the product-sum operation unit 10. In the product-sum operation unit 10, the circuit MEM and the circuit MAC are electrically connected to each other by a wiring WS and a wiring WO.

Figure 3:
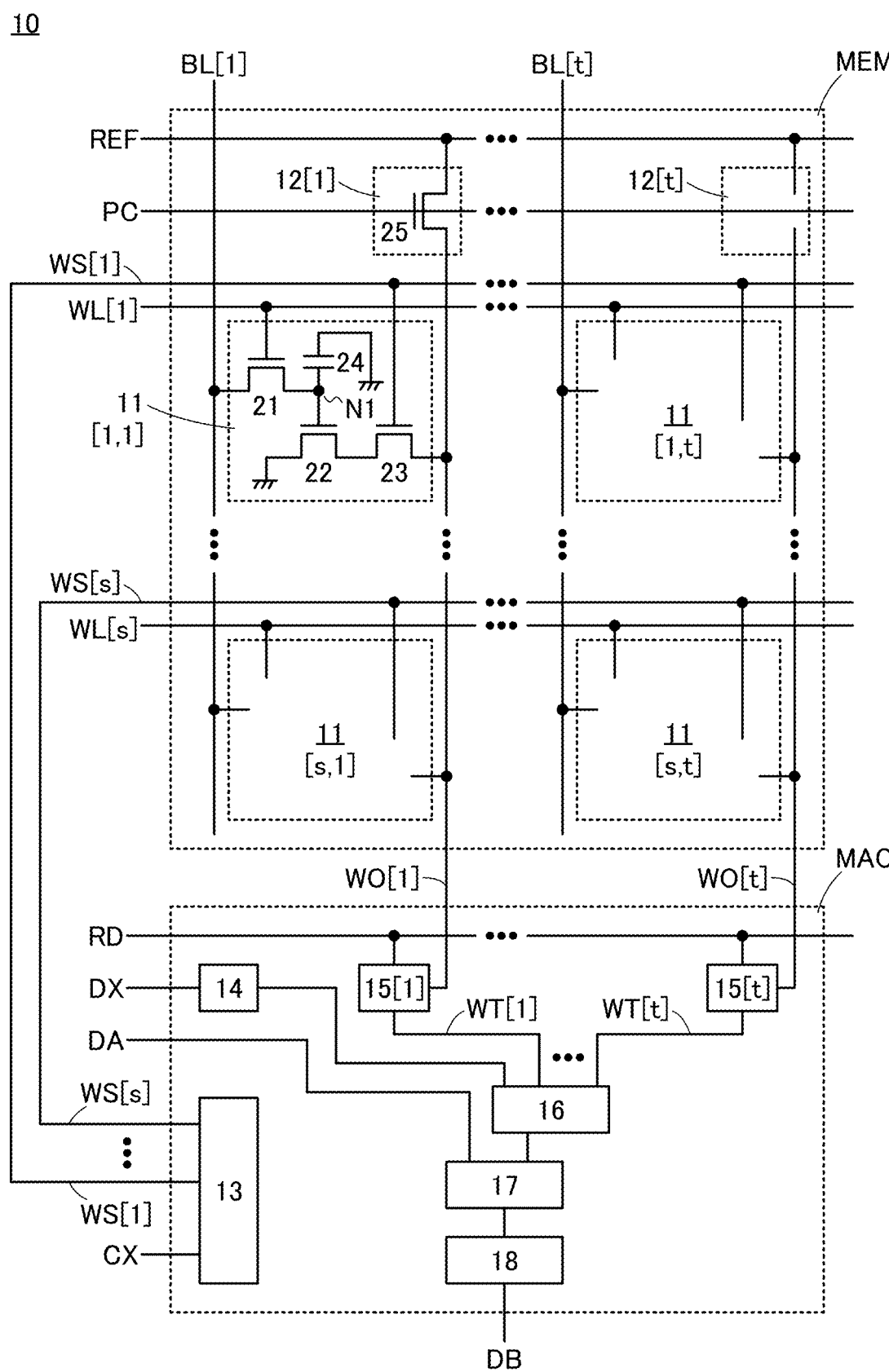
FIG. 3 is a circuit diagram illustrating a structure example of a product-sum operation unit.

FIG. 3 is a circuit diagram illustrating a structure example of the product-sum operation unit 10. The product-sum operation unit 10 includes the circuit MEM, the circuit MAC, a wiring REF, a wiring PC, a wiring RD, a wiring DX, a wiring DA, a wiring DB, a wiring CX, s wirings WS, and t wirings WO (s and t are integers greater than or equal to 1).

The circuit MEM and the circuit MAC are electrically connected to each other through the s wirings WS and the t wirings WO. Furthermore, out of the wirings WL and the wirings BL included in the product-sum operation block 113, the s wirings WL and the t wirings BL are provided in the circuit MEM as illustrated in FIG. 3.

<Structure Example of Circuit MEM>

The circuit MEM includes t precharge circuits 12 and s×t memory cells 11 which are arranged in a matrix of s rows and t columns. In FIG. 3, [1, 1], [s, 1], [1, t], and [s, t] represent the addresses of the memory cells 11.

Note that in the drawings described in this specification and the like, in the case where the number of components such as the precharge circuits 12 or the memory cells 11 is more than one, one of the components is illustrated in detail in a circuit diagram or the like and the detailed illustration of the others is omitted in some cases. For example, in FIG. 3, a circuit diagram of the memory cell 11[1, 1] is illustrated and circuit diagrams of the memory cell 11[s, 1], the memory cell 11[1, t], and the memory cell 11 [s, t] are omitted.

The memory cells 11 are electrically connected to the wirings WS and the wirings WO; in the case where k is an integer greater than or equal to 1 and less than or equal to s and l is an integer greater than or equal to 1 and less than or equal to t, the memory cell 11 [k, l] is electrically connected to the wiring WS [k] and the wiring WO[l] (k and l are not illustrated). Furthermore, the memory cell 11 [k, l] is electrically connected to the wiring WL[k] and the wiring BL[l].

Similarly, the precharge circuits 12 are electrically connected to the wirings WO, and the precharge circuit 12[l] is electrically connected to the wiring WO[l]. In addition, the precharge circuits 12 are electrically connected to the wiring REF and the wiring PC.

The precharge circuit 12 includes a transistor 25 and has a function of precharging the wiring WO. One of a source and a drain of the transistor 25 is electrically connected to the wiring REF, the other of the source and the drain of the transistor 25 is electrically connected to the wiring WO, and a gate of the transistor 25 is electrically connected to the wiring PC. In other words, the precharge circuit 12 has a function of precharging the wiring WO with a potential supplied to the wiring REF in the case where a high-level potential is applied to the wiring PC to bring the transistor 25 into an on state.

The memory cell 11 includes a transistor 21 to a transistor 23 and a capacitor 24. One of a source and a drain of the transistor 21 is electrically connected to the wiring BL, the other of the source and the drain of the transistor 21 is electrically connected to a gate of the transistor 22 and one electrode of the capacitor 24, and a gate of the transistor 21 is electrically connected to the wiring WL. One of a source and a drain of the transistor 22 is electrically connected to one of a source and a drain of the transistor 23, and the other of the source and the drain of the transistor 23 is electrically connected to the wiring WO.

Moreover, the other of the source and the drain of the transistor 22 is electrically connected to a reference potential, and the other electrode of the capacitor 24 is electrically connected to a reference potential, for example. Note that a connection portion of the other of the source and the drain of the transistor 21, the gate of the transistor 22, and the one electrode of the capacitor 24 is referred to as a node N1.

The memory cell 11 has a function of storing data by accumulating and retaining electric charge. The memory cell 11 has a function of storing binary data (high-level or low-level data), for example. In this embodiment, the low level is expressed using the above-described reference potential. A potential expressing the high level can be supplied to the wiring REF.

To write data to the memory cell 11, the wiring BL and the wiring WL are used. In the case where data is written to the memory cell 11, the wiring BL functions as a bit line, the wiring WL functions as a word line, and the transistor 21 functions as a switch for controlling conduction/non-conduction between the one electrode of the capacitor 24 and the wiring BL. Data is written in such a manner that a high-level potential is applied to the wiring WL to bring the one electrode of the capacitor 24 and the wiring BL into a conduction state, and a potential of the wiring BL is written to the node N1.

To read data from the memory cell 11, the wiring WO, the wiring WS, and the precharge circuit 12 are used. In the case where data is read from the memory cell 11, the transistor 22 is in a conduction state or a non-conduction state depending on the potential of the node N1, and the transistor 23 functions as a switch for controlling conduction/non-conduction between the one of the source and the drain of the transistor 22 and the wiring WO.

Data is read in such a manner that after a high-level potential (the potential supplied to the wiring REF) is applied to the wiring WO with the use of the precharge circuit 12, the wiring WO is brought into a floating state (an electrically floating state), and then a high-level potential is applied to the wiring WS to bring the one of the source and the drain of the transistor 22 and the wiring WO into a conduction state. Specifically, in the case where the potential of the node N1 is at the high level, the transistor 22 is in a conduction state and the wiring WO is brought to the low level (reference potential). In the case where the potential of the node N1 is at the low level, the transistor 22 is in a non-conduction state and the wiring WO keeps the high level.

Here, the transistor 21 to the transistor 23 and the transistor 25 are transistors including a metal oxide in their channel formation regions (OS transistors). For example, in the channel formation region of the transistor 21, a metal oxide containing any one of indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, a metal oxide formed of indium, gallium, and zinc is preferable.

Since the OS transistor has an extremely low off-state current, the memory cell 11 can retain electric charge accumulated in the capacitor 24 for a long time when the OS transistor is used as the transistor 21. Furthermore, in the case where the OS transistor is used as the transistor 21, even when the capacitance of the capacitor 24 included in the memory cell 11 is reduced, the accumulated electric charge in the capacitor 24 can be retained. Moreover, the off-state current of the OS transistor is unlikely to increase even under a high temperature environment, making the memory cell 11 highly reliable.

Furthermore, the transistor 21 to the transistor 23 and the transistor 25 may have a back gate. For example, in the case where the transistor 21 has a back gate, the threshold voltage of the transistor 21 can be increased and decreased by application of a predetermined potential to the back gate of the transistor 21. Alternatively, when the back gate of the transistor 21 is electrically connected to the gate of the transistor 21, the on-state current of the transistor 21 can be increased.

Furthermore, the capacitor 24 has a structure in which an insulator is sandwiched between conductors serving as electrodes. As a conductor included in the electrode, a semiconductor to which a conductivity is imparted or the like can be used besides metal.

<Structure Example of Circuit MAC>

The circuit MAC includes a decoder circuit 13, a register circuit 14, t circuits 15, a multiplier circuit 16, an adder circuit 17, a register circuit 18, and t wirings WT. Note that the multiplier circuit 16 and the adder circuit 17 constitute a product-sum operation circuit.

The circuit MAC can be formed of a CMOS (Complementary Metal Oxide Semiconductor) circuit that uses Si transistors, for example. The CMOS circuit, which is for example formed of an n-channel transistor and a p-channel transistor formed on a single crystal silicon substrate, is widely used as a circuit (also referred to as a digital circuit or a logic circuit) which handles a digital signal represented by a high level or a low level (expressed as High or Low, H or L, or 1 or 0, for example).

Note that a signal with an information amount of a plurality of bits may be input to the wiring DX, the wiring DA, and the wiring CX. For example, the signal input to the wiring DX may have an information amount of 8 bits, 16 bits, 32 bits, or 64 bits.

The decoder circuit 13 is electrically connected to the wiring CX and the s wirings WS and has a function of decoding the signal input to the wiring CX and driving the s wirings WS. Specifically, the decoder circuit 13 selects one of the wiring WS[1] to the wiring WS[s] in accordance with the signal input to the wiring CX and applies a high-level potential to the selected wiring WS.

The register circuit 14 is electrically connected to the wiring DX and has a function of temporarily retaining the signal input to the wiring DX. The register circuit 14 retains the signal input to the wiring DX and outputs the signal to the multiplier circuit 16.

Figure 4A:
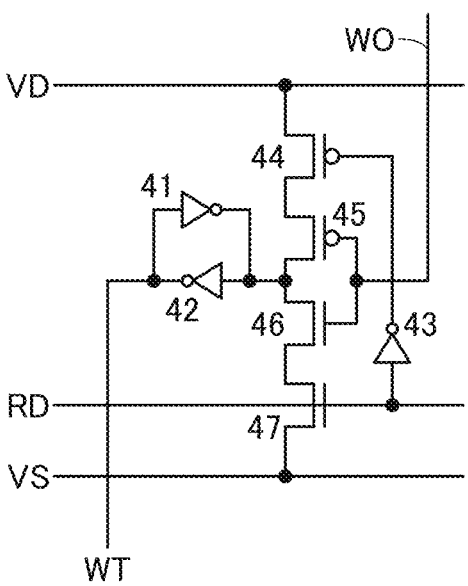
FIG. 4A is a circuit diagram illustrating a structure example of a circuit 15.

A structure example of the circuit 15 is illustrated in a circuit diagram of FIG. 4A. The circuit 15 includes an inverter 41 to an inverter 43, a transistor 44 to a transistor 47, a wiring VD, and a wiring VS.

One of a source and a drain of the transistor 44 is electrically connected to the wiring VD; the other of the source and the drain of the transistor 44 is electrically connected to one of a source and a drain of the transistor 45; the other of the source and the drain of the transistor 45 is electrically connected to one of a source and a drain of the transistor 46, an input terminal of the inverter 42, and an output terminal of the inverter 41; the other of the source and the drain of the transistor 46 is electrically connected to one of a source and a drain of the transistor 47; and the other of the source and the drain of the transistor 47 is electrically connected to the wiring VS.

A gate of the transistor 44 is electrically connected to an output terminal of the inverter 43, a gate of the transistor 45 is electrically connected to a gate of the transistor 46 and the wiring WO, and a gate of the transistor 47 is electrically connected to an input terminal of the inverter 43 and the wiring RD. Furthermore, an output terminal of the inverter 42 is electrically connected to an input terminal of the inverter 41 and the wiring WT.

A high power supply potential VDD is supplied to the wiring VD, and a low power supply potential VSS is supplied to the wiring VS. Note that the low power supply potential VSS may be used as a reference potential in the semiconductor device 100.

In the circuit 15, in the case where a high-level potential is applied to the wiring RD, the inverter 43 outputs a low-level potential, so that the transistor 44 and the transistor 47 are brought into an on state, and the transistor 45 and the transistor 46 function as an inverter. Moreover, the inverter 41 and the inverter 42 form an inverter loop and have a function of a memory. Thus, the circuit 15 has a function of obtaining a potential state (high level or low level) of the wiring WO at the time when the high-level potential is applied to the wiring RD, retaining the potential state with the use of the inverter 41 and the inverter 42, and outputting the potential state to the wiring WT.

The signal output to the wiring WT is multiplied by the signal output from the register circuit 14 in the multiplier circuit 16 and output to the adder circuit 17. The adder circuit 17 adds the signal output from the multiplier circuit 16 and the signal input to the wiring DA and outputs the resulting signal to the register circuit 18. The register circuit 18 temporarily retains the signal output from the adder circuit 17 and outputs the signal through the wiring DB to the outside of the product-sum operation unit 10.

Note that the descriptions of the decoder circuit, the register circuit, the multiplier circuit, and the adder circuit are omitted because the decoder circuit, the register circuit, the multiplier circuit, and the adder circuit each formed of a CMOS circuit are known.

<Product-Sum Operation Unit>

Here, the signal input to the wiring DX is a data signal X, the signal input to the wiring DA is a data signal A, and the signal output to the wiring DB is a data signal B. Furthermore, the signal output to the t wirings WT (the wiring WT[1] to the wiring WT[t]) is a data signal W. In other words, the product-sum operation unit 10 has a function of outputting the data signal B, and the data signal B is a result of multiplying the data signal X by the data signal W and adding the data signal A thereto.

Since the circuit MEM includes the s×t memory cells 11, the circuit MEM has a function of storing a data signal W[1] to a data signal W[s] in the memory cells 11. The data signal W[1] to the data signal W[s] can be read in time segments by driving the wiring WS[1] to the wiring WS[s].

Figure 4B:
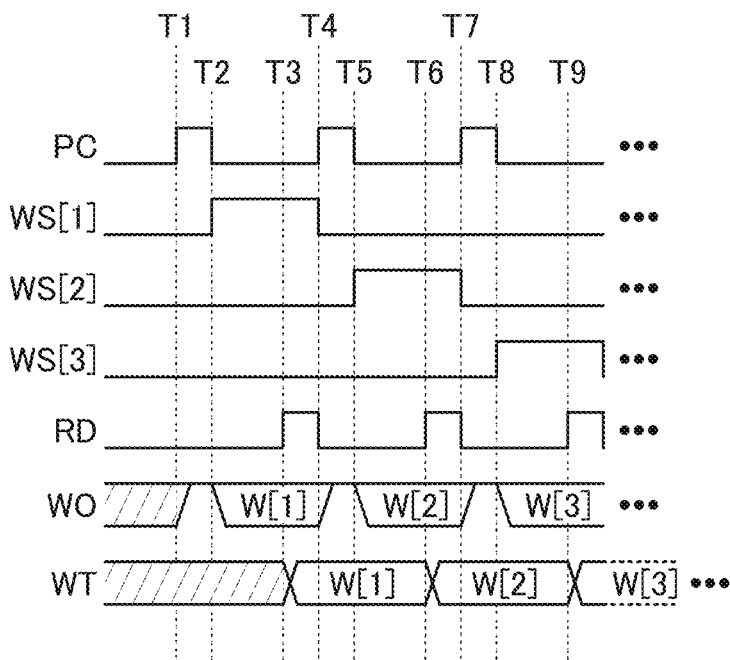
FIG. 4B is a timing chart.

For example, a case where the data signal W[1] to the data signal W[3] among the data signal W[1] to the data signal W[s] are read to the wirings WT is illustrated in a timing chart of FIG. 4B. FIG. 4B is a timing chart illustrating the potential states (high level or low level) of the wiring PC, the wiring WS[1] to the wiring WS[3], the wiring RD, the wiring WO, and the wiring WT from Time T1 to Time T9.

As illustrated in FIG. 4B, at Time T1, the wiring PC is brought to the high level, so that the wirings WO are precharged with the high-level potential. At Time T2, the wiring WS[1] is brought to the high level, so that the wirings WO are brought into the potential states corresponding to the data stored in the memory cell 11[1, 1] to the memory cell 11[1, t] (expressed as W[1] in FIG. 4B). At Time T3, the wiring RD is brought to the high level, so that the potential states of the wirings WO are output to the wirings WT.

At Time T4, the wiring PC is brought to the high level, so that the wirings WO are precharged with the high-level potential. At Time T5, the wiring WS[2] is brought to the high level, so that the wirings WO are brought into the potential states corresponding to the data stored in the memory cell 11[2, 1] to the memory cell 11[2, t] (expressed as W[2] in FIG. 4B). At Time T6, the wiring RD is brought to the high level, so that the potential states of the wirings WO are output to the wirings WT. The same applies to Time T7 to Time T9, and the description thereof is omitted.

Also as the data signal X and the data signal A, a plurality of data signals X and a plurality of data signals A are prepared and input to the product-sum operation unit 10 in time segments, whereby a plurality of product-sum operations can be performed.

For example, s data signals X (a data signal X[1] to a data signal X[s]) and s data signals A (a data signal A[1] to a data signal A[s]) are prepared, each of the data signal X[1] to the data signal X[s] is multiplied by the data signal W[1] to the data signal W[s] read from the memory cells 11, and the data signal A[1] to the data signal A[s] are added thereto, so that s data signals B (a data signal B[1] to a data signal B[s]) can be obtained. In other words, in the case where k is an integer greater than or equal to 1 and less than or equal to s, the data signal B[k]=the data signal X[k]×the data signal W[k]+the data signal A[k] is satisfied.

Furthermore, when the data signal B[k] is input to the data signal A[k+1] and the data signal A[1] is 0, the following can be obtained: the data signal B=the data signal X[1]×the data signal W[1]+the data signal X[2]×the data signal W[2]+ (Omitted)+the data signal X[s−1]×the data signal W[s−1]+ the data signal X[s]×the data signal W[s].

Figures 5A, 5B, 5C:
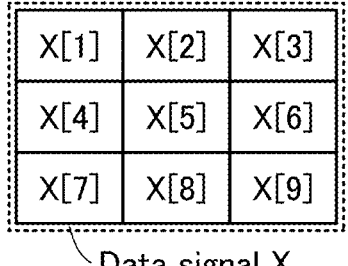
FIG. 5A is a conceptual diagram of a data signal X and a data signal W.
FIG. 5B is a conceptual diagram of image data P.
FIG. 5C is a conceptual diagram of a filter F.

For example, in the case of s=9, the data signals X can be data signals with three rows and three columns, and the data signals W can be data signals with three rows and three columns. A conceptual diagram of the data signals X and the data signals W in the case of s=9 is illustrated in FIG. 5A. In this case, the data signal B=the data signal X[1]×the data signal W[1]+the data signal X[2]×the data signal W[2]+ (Omitted)+the data signal X[8]×the data signal W[8]+the data signal X[9]×the data signal W[9] can be used in a convolutional operation for image data, for example.

<Convolutional Operation>

Next, an example of the convolutional operation for image data is described. Image data with p rows and q columns is represented by image data P(1, 1) to P (p, q) (p and q are integers greater than or equal to 2), and filters with u rows and v columns are represented by filters F(1, 1) to F (u, v) (u and v are integers greater than or equal to 1; u<p, v<q). Each of the image data P(1, 1) to P (p, q) corresponds to image data for one pixel, and each of the filters F(1, 1) to F (u, v) is a parameter constituting the filter. FIG. 5B is a conceptual diagram of the image data P, and FIG. 5C is a conceptual diagram of the filters F.

For example, when p=q=3 and u=v=2, the following Y(1, 1) to Y(2, 2) are calculated.

$$Y(1, 1)=P(1, 1)×F(1, 1)+P(1, 2)×F(1, 2)+P(2, 1)×F\\(2, 1)+P(2, 2)×F(2, 2) \tag{a1}$$

$$Y(1, 2)=P(1, 2)×F(1, 1)+P(1, 3)×F(1, 2)+P(2, 2)×F\\(2, 1)+P(2, 3)×F(2, 2) \tag{a2}$$

$$Y(2, 1)=P(2, 1)×F(1, 1)+P(2, 2)×F(1, 2)+P(3, 1)×F\\(2, 1)+P(3, 2)×F(2, 2) \tag{a3}$$

$$Y(2, 2)=P(2, 2)×F(1, 1)+P(2, 3)×F(1, 2)+P(3, 2)×F\\(2, 1)+P(3, 3)×F(2, 2) \tag{a4}$$

Equations a1 to a4 can be expressed by the following general formula:

$$Y(x, y)=Σa(ΣbP(a+x-1, b+y-1)×F(a, b)) \tag{a5}.$$

Note that a is an integer of 1 to u, b is an integer of 1 to v, x is an integer of 1 to p−u+1, and y is an integer of 1 to q−v+1. For example, in the case of calculating Y(1, 1), a product-sum operation is performed on the image data P in a region 50 illustrated in FIG. 5B.

The convolutional operation for image data is performed by calculating Y(1, 1) to Y(u, v) using the above-described product-sum operation. The convolutional operation for image data enables detection of an edge or the like of an image, for example. When the convolutional operation is performed a plurality of times, features of the image data such as the shape and pattern of the image can be detected. This convolutional operation is utilized in the field of image recognition.

The product-sum operation unit 10 can perform the above-described convolutional operation by storing the parameters of the filters F in the memory cells 11 and inputting the image data P as the data signal X. The parameters of the filters F used for the convolutional operation are generated by learning, for example, and the parameters of the filters F that have finished learning are repeatedly used. In the product-sum operation units 10, the parameters of the filters F are extracted as the data signals W using the wirings WS and the wirings WO included in each product-sum operation unit 10; thus, the product-sum operation units 10 are efficient in terms of repeated use of the parameters of the filters F.

Note that a convolutional operation may be performed using a plurality of product-sum operation units 10. Since the image data P and the filters F are two-dimensional data, the filters F(1, 1) to F(u, v) with u rows and v columns can be stored as follows, for example: the filters F(1, 1) to F(1, v), the filters F(2, 1) to F(2, v), (omitted), and the filters F(u, 1) to F(u, v) are stored in the product-sum operation unit 10[1, 1], the product-sum operation unit 10[2, 1], (omitted), and the product-sum operation unit 10[u, 1], respectively (m>=u). In this case, the product-sum operations for the image data P(1, 1) to P(1, v), the image data P(2, 1) to P(2, v), (omitted), and the image data P(u, 1) to P(u, v) can be performed by the product-sum operation unit 10[1, 1], the product-sum operation unit 10[2, 1], (omitted), and the product-sum operation unit 10[u, 1], respectively. These results are added, so that Y(1, 1) can be calculated.

Although an example where the product-sum operation units 10 are used for the convolutional operation for image data has been described in this embodiment, the product-sum operation is frequently used in neural networks that resemble a biological neural network composed of neurons and synapses and the product-sum operation units 10 can also be used in a neural network. In the case where the product-sum operation units 10 are used in a neural network, the parameters of the filters F correspond to weight coefficients; the product-sum operation units 10 can efficiently use the weight coefficients by storing the weight coefficients in the memory cells 11.

In the semiconductor device 100 of one embodiment of the present invention, the layer including the OS transistor is provided to be stacked above the layer including the transistors formed on the semiconductor substrate. A memory cell is formed using the OS transistor. Since the OS transistor has an extremely low off-state current, the memory cell formed using the OS transistor can retain the stored data for a long time.

Moreover, the product-sum operation circuit is formed using the transistors formed on the semiconductor substrate and is electrically connected to the memory cells provided to be stacked thereabove through the wirings WS and the wirings WO. The semiconductor device 100 includes the plurality of product-sum operation units 10 in each of which the product-sum operation circuit and the memory cells are combined. By reading the parameters of the filters F (or weight coefficients) stored in the memory cells in each of the product-sum operation units 10, a convolutional operation (or calculation using a neural network) can be performed efficiently. The semiconductor device 100 can be suitably used for a convolutional operation where parameters of the filters F are repeatedly used (or calculation of a neural network where weight coefficients are repeatedly used).

Since the memory cells are provided to be stacked above the product-sum operation circuit in the semiconductor device 100, the semiconductor device 100 is small in size. The off-state current of the OS transistor is unlikely to increase even under a high temperature environment, making the memory cells highly reliable against heat generation of the product-sum operation circuit. Furthermore, the OS transistor can be manufactured with a manufacturing apparatus similar to that for a Si transistor and thus the semiconductor device 100 can be manufactured at low cost.

Note that this embodiment can be implemented in appropriate combination with the other embodiments described in this specification.

Embodiment 2

In this embodiment, structure examples of the transistor included in the semiconductor device 100 described in the above embodiment are described. In this embodiment, structure examples of a semiconductor device having a structure where a layer including an OS transistor is provided to be stacked above a layer including a Si transistor formed in a single crystal silicon substrate is described.

<Structure Example of Semiconductor Device>

Figure 6:
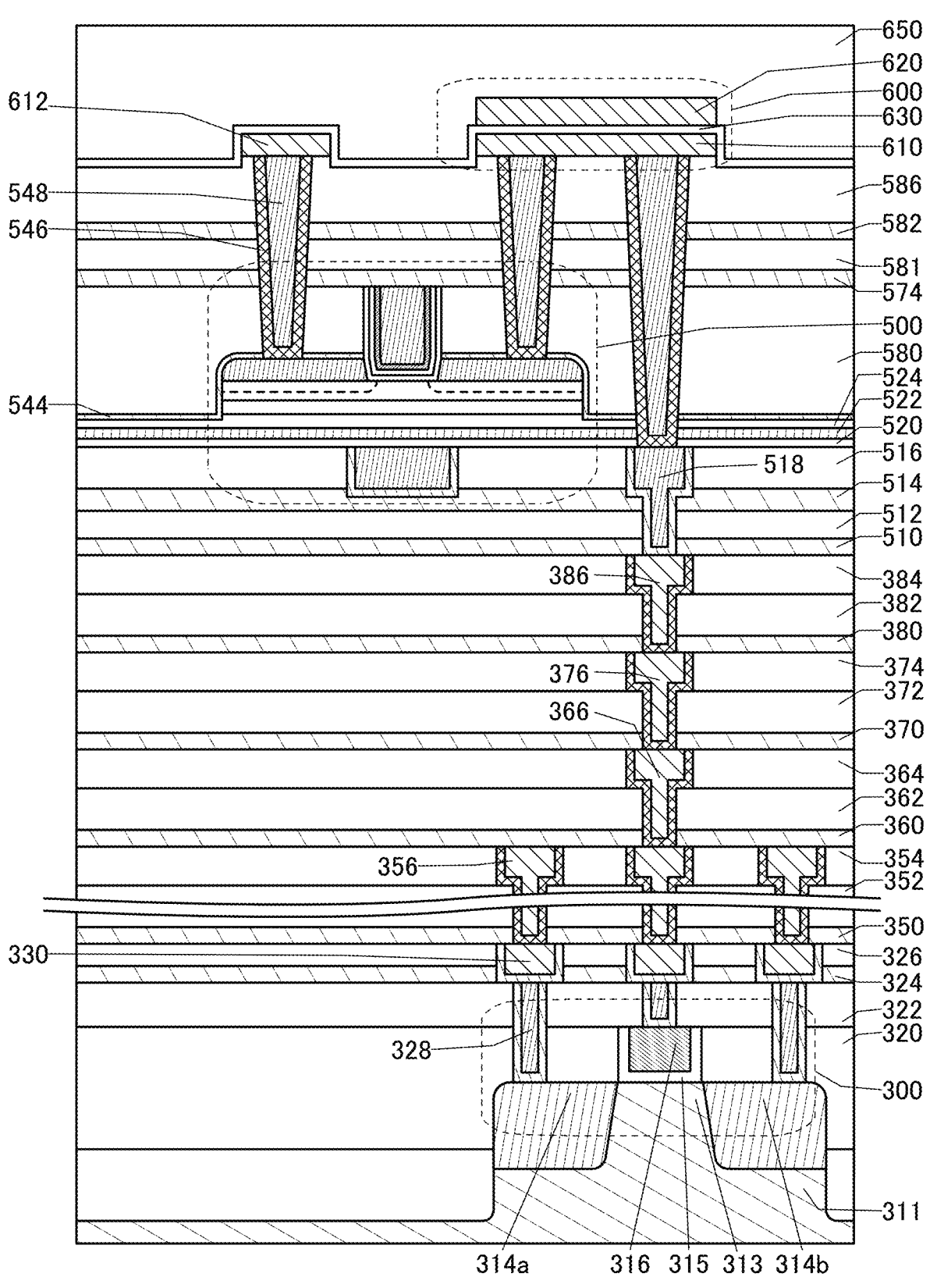
FIG. 6 is a cross-sectional view illustrating a structure example of a memory device.
Figure 7A:
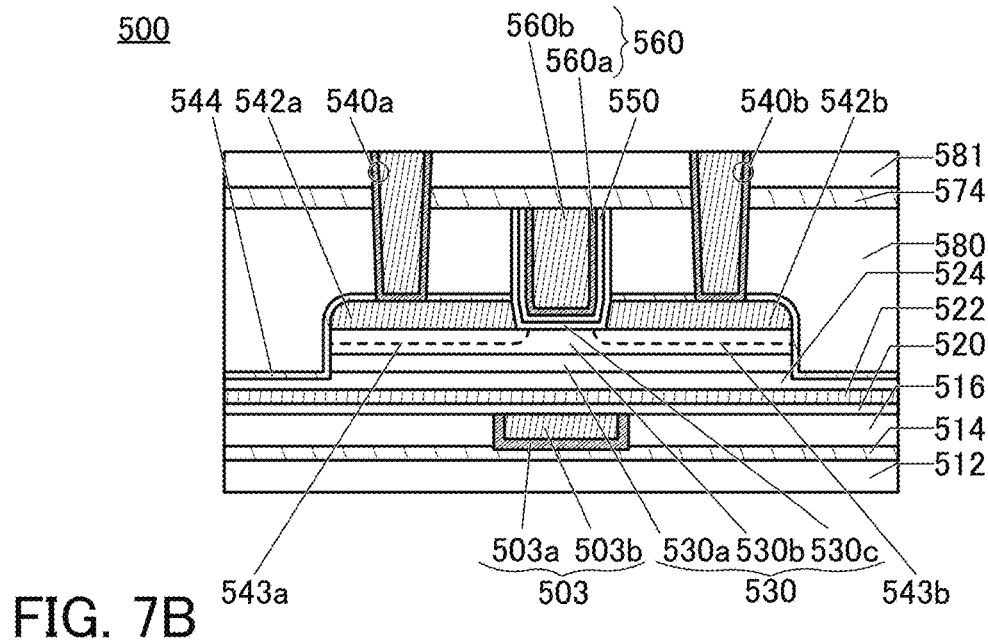
FIG. 7A to FIG. 7C are cross-sectional views illustrating structure examples of transistors.
Figure 7B:
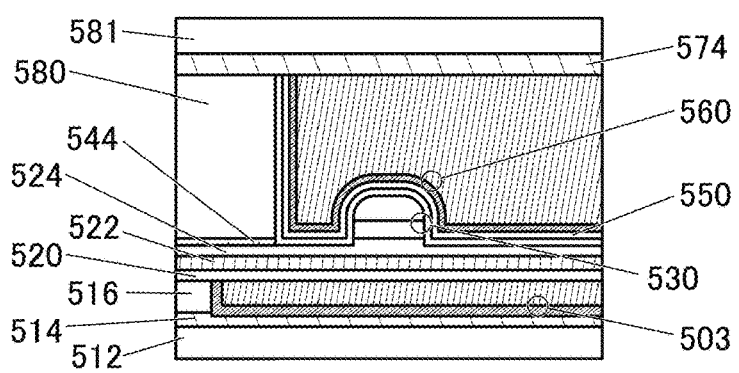
Figure 7C:
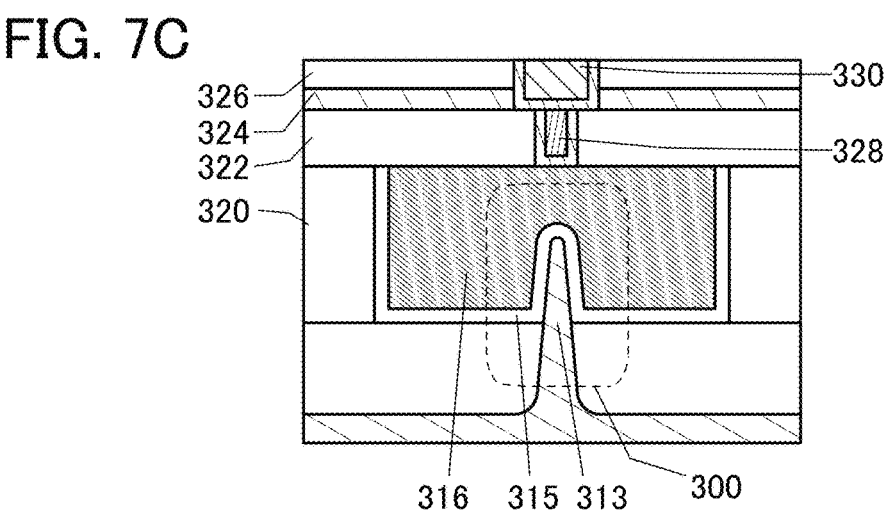

A semiconductor device illustrated in FIG. 6 includes a transistor 300, a transistor 500, and a capacitive element 600. FIG. 7A is a cross-sectional view of the transistor 500 in the channel length direction, FIG. 7B is a cross-sectional view of the transistor 500 in the channel width direction, and FIG. 7C is a cross-sectional view of the transistor 300 in the channel width direction.

For example, the transistor 500 corresponds to the transistor 21 described in the above embodiment, and the transistor 500 includes a second gate (also referred to as a bottom gate or a back gate) in addition to a first gate (also referred to as a top gate, or simply a gate). Furthermore, the transistor 300 corresponds to, for example, the transistor 47 included in the semiconductor device 100, and the capacitive element 600 corresponds to the capacitor 24.

The transistor 500 is a transistor including a metal oxide in its channel formation region (an OS transistor). The transistor 500 has features that the off-state current is extremely low and unlikely to increase even under a high temperature environment. Thus, using such a transistor 500 in the semiconductor device 100 in the above-described embodiment enables the semiconductor device to be highly reliable.

As illustrated in FIG. 6, in the semiconductor device described in this embodiment, the transistor 500 is provided above the transistor 300, and the capacitive element 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 7C, in the transistor 300, a top surface and a side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

It is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that since the work function of a conductor depends on a material of the conductor, Vth of the transistor can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Note that the transistor 300 shown in FIG. 6 is an example and is not limited to the structure shown therein; an appropriate transistor is used in accordance with a circuit configuration or a driving method.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 300 or the like provided below the insulator 322. For example, the top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into the region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, the parasitic capacitance generated between wirings can be reduced.

A conductor 328, a conductor 330, and the like that are connected to the capacitive element 600 or the transistor 500 are embedded in the insulator 320, the insulator 322, the insulator 324, and the insulator 326. Note that the conductor 328 and the conductor 330 have a function of a plug or a wiring. A plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and another part of the conductor functions as a plug.

As a material for each of plugs and wirings (the conductor 328, the conductor 330, and the like), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 326 and the conductor 330. For example, in FIG. 6, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against hydrogen. The conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 6, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

For example, like the insulator 324, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 364 and the conductor 366. For example, in FIG. 6, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

For example, like the insulator 324, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by the barrier layer, so that diffusion of hydrogen from the transistor 300 into the transistor 500 can be inhibited.

A wiring layer may be provided over the insulator 374 and the conductor 376. For example, in FIG. 6, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

For example, like the insulator 324, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by the barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen or hydrogen is preferably used for any of the insulator 510, the insulator 512, the insulator 514, and the insulator 516.

For example, the insulator 510 and the insulator 514 are preferably formed using, for example, a film having a barrier property that prevents diffusion of hydrogen or impurities from the substrate 311, the region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used as the insulator 510 and the insulator 514, for example, a metal oxide such as aluminum oxide, hafnium oxide, or tantalum oxide is preferably used.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. When a material with a relatively low permittivity is used for the interlayer film, the parasitic capacitance between wirings can be reduced. Silicon oxide films, silicon oxynitride films, or the like can be used as the insulator 512 and the insulator 516, for example.

A conductor 518, a conductor included in the transistor 500 (a conductor 503), and the like are embedded in the insulator 510, the insulator 512, the insulator 514, and the insulator 516. Note that the conductor 518 has a function of a plug or a wiring that is connected to the capacitive element 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; thus, the diffusion of hydrogen from the transistor 300 into the transistor 500 can be inhibited.

The transistor 500 is provided above the insulator 516.

As illustrated in FIG. 7A and FIG. 7B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542a and the conductor 542b and is provided with an opening formed to overlap a region between the conductor 542a and the conductor 542b; a conductor 560 positioned in the opening; an insulator 550 positioned between the conductor 560 and the oxide 530b, the conductor 542a, the conductor 542b, and the insulator 580; and an oxide 530c positioned between the insulator 550 and the oxide 530b, the conductor 542a, the conductor 542b, and the insulator 580.

As illustrated in FIG. 7A and FIG. 7B, an insulator 544 is preferably positioned between the insulator 580 and the oxide 530a, the oxide 530b, the conductor 542a, and the conductor 542b. In addition, as illustrated in FIG. 7A and FIG. 7B, the conductor 560 preferably includes a conductor 560a provided inside the insulator 550 and a conductor 560b embedded inside the conductor 560a. As illustrated in FIG. 7A and FIG. 7B, an insulator 574 is preferably positioned over the insulator 580, the conductor 560, and the insulator 550.

Hereinafter, the oxide 530a, the oxide 530b, and the oxide 530c may be collectively referred to as an oxide 530. The conductor 542a and the conductor 542b may be collectively referred to as a conductor 542.

Note that the transistor 500 having a structure in which three layers of the oxide 530a, the oxide 530b, and the oxide 530c are stacked in the region where the channel is formed and its vicinity is illustrated; however, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 having a stacked-layer structure of two layers in the transistor 500 is illustrated, the present invention is not limited thereto. For example, the conductor 560 may have a single-layer structure or a stacked-layer structure of three or more layers. The transistor 500 illustrated in FIG. 6, FIG. 7A, and FIG. 7B is an example, and the structure is not limited thereto; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b are selected in a self-aligned manner with respect to the opening of the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not include a region overlapping the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate electrode. In addition, the conductor 503 sometimes functions as a second gate electrode. In that case, Vth of the transistor 500 can be controlled by changing a potential applied to the conductor 503 independently of a potential applied to the conductor 560. In particular, Vth of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to be overlapped by the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the S-channel structure has a feature that the side surface and the vicinity of the oxide 530 in contact with the conductor 542a and the conductor 542b functioning as the source electrode and the drain electrode are of i-type like the channel formation region. The side surface and the vicinity of the oxide 530 in contact with the conductor 542a and the conductor 542b are in contact with the insulator 544 and thus can be of i-type like the channel formation region. Note that in this specification and the like, "i-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

The conductor 503 has a structure similar to that of the conductor 518; a conductor 503a is formed in contact with an inner wall of an opening in the insulator 514 and the insulator 516, and a conductor 503b is formed on the inner side.

The insulator 520, the insulator 522, the insulator 524, and the insulator 550 each have a function of a gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material from which part of oxygen is released by heating is preferably used. An oxide from which oxygen is released by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

When the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

When the insulator 522 has a function of inhibiting diffusion of oxygen or impurities, oxygen contained in the oxide 530 is not diffused to the insulator 520 side, which is preferable. Furthermore, the conductor 503 can be inhibited from reacting with oxygen contained in the insulator 524 or the oxide 530.

For example, the insulator 522 is preferably formed using a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), (Ba,Sr)$TiO_3$ (BST), or the like. With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

It is preferable that the insulator 520 be thermally stable. For example, silicon oxide and silicon oxynitride, which have thermal stability, are preferable. Furthermore, when an insulator that is a high-k material is combined with silicon oxide or silicon oxynitride, the insulator 520 having a stacked-layer structure that has thermal stability and a high dielectric constant can be obtained.

Note that the insulator 520, the insulator 522, and the insulator 524 may each have a stacked-layer structure of two or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. Furthermore, as the oxide 530, an In—Ga oxide or an In—Zn oxide may be used.

Note that the metal oxide functioning as an oxide semiconductor may be formed by a sputtering method or an ALD (Atomic Layer Deposition) method. The metal oxide functioning as an oxide semiconductor will be described in another embodiment.

Furthermore, a metal oxide with a low carrier density is preferably used in the transistor 500. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen has entered functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics.

A defect that is an oxygen vacancy into which hydrogen has entered can function as a donor of a metal oxide. However, it is difficult to evaluate the defects quantitatively. Thus, the metal oxide is sometimes evaluated by not its donor concentration but its carrier density. Therefore, in this specification and the like, as the parameter of the metal oxide, the carrier density assuming the state where an electric field is not applied is sometimes used instead of the donor concentration. That is, "carrier density" in this specification and the like can be replaced with "donor concentration" in some cases.

Consequently, when a metal oxide is used for the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide 530, the carrier density of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. Note that the lower limit of the carrier density of the metal oxide in the channel formation region is not particularly limited and can be, for example, $1\times10^{-9}$ cm$^{-3}$.

When a metal oxide is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly possible that oxidation of the conductor 542 lowers the conductivity of the conductor 542. Note that diffusion of oxygen in the oxide 530 into the conductor 542 can be interpreted as absorption of oxygen in the oxide 530 by the conductor 542.

When oxygen in the oxide 530 is diffused into the conductor 542 (the conductor 542a and the conductor 542b), a layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 542 and the oxide 530b, but the layer may be formed between the conductor 542 and the oxide 530c, or formed between the conductor 542 and the oxide 530b and between the conductor 542 and the oxide 530c.

The metal oxide functioning as the channel formation region in the oxide 530 has a bandgap of preferably 2 eV or larger, further preferably 2.5 eV or larger. With the use of a metal oxide having such a wide bandgap, the off-state current of the transistor can be reduced.

Note that semiconductor materials that can be used for the oxide 530 are not limited to the above metal oxides. A semiconductor material having a bandgap (a semiconductor material that is not a zero-gap semiconductor) can be used for the oxide 530. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as a semiconductor material.

Here, in this specification and the like, the layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

As the oxide 530, a transition metal chalcogenide functioning as a semiconductor is preferably used, for example. Specific examples of the transition metal chalcogenide which can be used for the oxide 530 include molybdenum sulfide (typically $MoS_2$), molybdenum selenide (typically $MoSe_2$), molybdenum telluride (typically $MoTe_2$), tungsten sulfide ($W_{52}$), tungsten selenide (typically $WSe_2$), tungsten telluride (typically $WTe_2$), hafnium sulfide ($HfS_2$), hafnium selenide ($HfSe_2$), zirconium sulfide ($ZrS_2$), and zirconium selenide ($ZrSe_2$).

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542 (the conductor 542a and the conductor 542b) functioning as the source electrode and the drain electrode is provided over the oxide 530b. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

As illustrated in FIG. 7A, a region 543 (a region 543a and a region 543b) is sometimes formed as a low-resistance region at and near the interface between the oxide 530 and the conductor 542. In that case, the region 543a functions as one of a source region and a drain region, and the region 543b functions as the other of the source region and the drain region. Furthermore, the channel formation region is formed in a region between the region 543a and the region 543b.

When the conductor 542 is provided in contact with the oxide 530, the oxygen concentration in the region 543 sometimes decreases. In addition, a metal compound layer that contains the metal contained in the conductor 542 and the component of the oxide 530 is sometimes formed in the region 543. In such a case, the carrier density of the region 543 increases, and the region 543 becomes a low-resistance region.

The insulator 544 is provided to cover the conductor 542 and inhibits oxidation of the conductor 542. At this time, the insulator 544 may be provided to cover a side surface of the oxide 530 and to be in contact with the insulator 524.

A metal oxide containing one or more kinds selected from hafnium, aluminum, gallium, yttrium, zirconium, tungsten, titanium, tantalum, nickel, germanium, magnesium, and the like can be used as the insulator 544.

For the insulator 544, it is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542 is an oxidation-resistant material or does not significantly lose its conductivity even after absorbing oxygen. Design is appropriately set in consideration of required transistor characteristics.

The insulator 550 functions as a gate insulating film. The insulator 550 is preferably positioned in contact with the inner side (the top surface and the side surface) of the oxide 530c. The insulator 550 is preferably formed using an insulator from which oxygen is released by heating. For example, the insulator 550 is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS analysis. Note that the temperature of the film surface in the TDS analysis is preferably within the range of 100° C. to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

To efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Although the conductor 560 functioning as the first gate electrode and having a two-layer structure is illustrated in FIG. 7A and FIG. 7B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used.

The conductor 560b is preferably formed using a conductive material containing tungsten, copper, or aluminum as its main component. Furthermore, the conductor 560b also functions as a wiring and thus is preferably a conductor having high conductivity. For example, a conductive material containing tungsten, copper, or aluminum as its main component can be used. The conductor 560b can have a stacked-layer structure, for example, a stacked-layer structure of any of the above conductive materials and titanium or titanium nitride.

The insulator 580 is provided over the conductor 542 with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. In particular, silicon oxide and porous silicon oxide are preferable because an excess-oxygen region can be easily formed in a later step.

Furthermore, when the insulator 580 from which oxygen is released by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening in the insulator 580 is formed to overlap the region between the conductor 542*a* and the conductor 542*b*. Accordingly, the conductor 560 is formed to be embedded in the opening in the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening in the insulator 580; thus, even when the conductor 560 has a shape with a high aspect ratio, the conductor 560 can be formed without collapsing during the process.

The insulator 574 is preferably provided in contact with the top surface of the insulator 580, the top surface of the conductor 560, and the top surface of the insulator 550. When the insulator 574 is deposited by a sputtering method, an excess-oxygen region can be provided in the insulator 550 and the insulator 580. Thus, oxygen can be supplied from the excess-oxygen region to the oxide 530.

As the insulator 574, a metal oxide containing one or more kinds selected from hafnium, aluminum, gallium, yttrium, zirconium, tungsten, titanium, tantalum, nickel, germanium, magnesium, and the like can be used, for example.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method serves as an oxygen supply source and can also have a function of a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably reduced.

A conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structures of the conductor 540*a* and the conductor 540*b* are similar to those of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has a high blocking effect that inhibits the passage of both oxygen and impurities such as hydrogen and moisture which are factors of a change in electrical characteristics of the transistor. Thus, aluminum oxide can prevent the entry of impurities such as hydrogen and moisture into the transistor 500 in the fabrication process and after the fabrication of the transistor. In addition, release of oxygen from the oxide included in the transistor 500 can be inhibited. Therefore, aluminum oxide is suitably used for a protective film of the transistor 500.

An insulator 586 is provided over the insulator 582. For the insulator 586, a material similar to that for the insulator 320 can be used. When a material with a relatively low permittivity is used for the interlayer film, the parasitic capacitance between wirings can be reduced. A silicon oxide film, a silicon oxynitride film, or the like can be used for the insulator 586, for example.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitive element 600, the transistor 500, or the transistor 300. The conductor 546 and the conductor 548 can be provided using a material similar to those for the conductor 328 and the conductor 330.

Next, the capacitive element 600 is provided above the transistor 500. The capacitive element 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitive element 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 having a single-layer structure are illustrated in FIG. 6, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap the conductor 610 with the insulator 630 therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a transistor including an oxide semiconductor and having a high on-state current can be provided. Alternatively, a transistor including an oxide semiconductor and having a low off-state current can be provided. Alternatively, a semiconductor device with low power consumption can be provided. Alternatively, a semiconductor device using a transistor including an oxide semiconductor can be miniaturized or highly integrated.

<Structure Example of Transistor>

Note that the structure of the transistor 500 in the semiconductor device described in this embodiment is not limited to the above. Examples of structures that can be used for the transistor 500 will be described below.

<Structure Example 1 of Transistor>

Figures 8A, 8B, 8C:
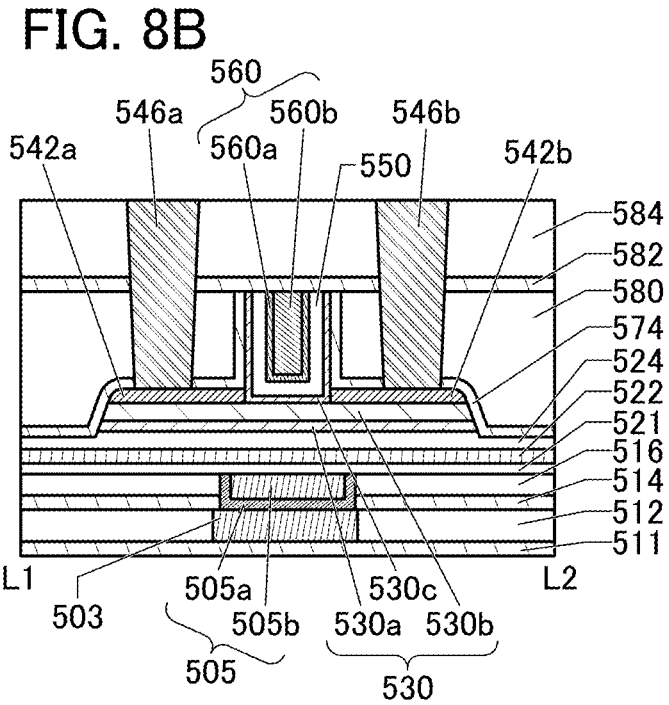
FIG. 8A is a top view illustrating a structure example of a transistor.
FIG. 8B and FIG. 8C are cross-sectional views illustrating the structure example of the transistor.

A structure example of a transistor 510A is described with reference to FIG. 8A, FIG. 8B, and FIG. 8C. FIG. 8A is a top view of the transistor 510A. FIG. 8B is a cross-sectional view of a portion indicated by the dashed-dotted line L1-L2 in FIG. 8A. FIG. 8C is a cross-sectional view of a portion indicated by the dashed-dotted line W1-W2 in FIG. 8A. Note that for clarity of the drawing, some components are not illustrated in the top view of FIG. 8A.

FIG. 8A, FIG. 8B, and FIG. 8C illustrate the transistor 510A and the insulator 511, the insulator 512, the insulator 514, the insulator 516, the insulator 580, the insulator 582, and an insulator 584 that function as interlayer films. In addition, the conductor 546 (a conductor 546a and a conductor 546b) that is electrically connected to the transistor 510A and functions as a contact plug, and the conductor 503 functioning as a wiring are illustrated.

The transistor 510A includes the conductor 560 (the conductor 560a and the conductor 560b) functioning as a first gate electrode; a conductor 505 (a conductor 505a and a conductor 505b) functioning as a second gate electrode; the insulator 550 functioning as a first gate insulating film; an insulator 521, the insulator 522, and the insulator 524 that function as a second gate insulating film; the oxide 530 (the oxide 530a, the oxide 530b, and the oxide 530c) including a region where a channel is formed; the conductor 542a functioning as one of a source and a drain; the conductor 542b functioning as the other of the source and the drain; and the insulator 574.

In the transistor 510A illustrated in FIG. 8, the oxide 530c, the insulator 550, and the conductor 560 are positioned in an opening portion provided in the insulator 580 with the insulator 574 therebetween. Moreover, the oxide 530c, the insulator 550, and the conductor 560 are positioned between the conductor 542a and the conductor 542b.

The insulator 511 and the insulator 512 each function as an interlayer film.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), or (Ba,Sr)TiO$_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulator 511 preferably functions as a barrier film that inhibits entry of impurities such as water or hydrogen into the transistor 510A from the substrate side. Accordingly, for the insulator 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of an oxygen atom, an oxygen molecule, and the like) (through which the above oxygen is less likely to pass). Moreover, aluminum oxide or silicon nitride, for example, may be used for the insulator 511. This structure can inhibit diffusion of impurities such as hydrogen and water to the transistor 510A side from the substrate side through the insulator 511.

For example, the permittivity of the insulator 512 is preferably lower than that of the insulator 511. When a material with a low permittivity is used for the interlayer film, the parasitic capacitance generated between wirings can be reduced.

The conductor 503 is formed to be embedded in the insulator 512. Here, the top surface of the conductor 503 and the top surface of the insulator 512 can be substantially level with each other. Note that although a structure in which the conductor 503 is a single layer is illustrated, the present invention is not limited thereto. For example, the conductor 503 may have a multilayer structure of two or more layers. Note that for the conductor 503, a conductive material that has high conductivity and contains tungsten, copper, or aluminum as its main component is preferably used.

In the transistor 510A, the conductor 560 sometimes functions as a first gate electrode. The conductor 505 sometimes functions as a second gate electrode. In that case, the threshold voltage of the transistor 510A can be controlled by changing a potential applied to the conductor 505 independently of a potential applied to the conductor 560. In particular, when a negative potential is applied to the conductor 505, the threshold voltage of the transistor 510A can be higher than 0 V, and the off-state current can be reduced. Thus, a drain current at the time when a potential applied to the conductor 560 is 0 V can be lower in the case where a negative potential is applied to the conductor 505 than in the case where a negative potential is not applied to the conductor 505.

For example, when the conductor 505 and the conductor 560 are provided to overlap each other, in the case where a potential is applied to the conductor 560 and the conductor 505, an electric field generated from the conductor 560 and an electric field generated from the conductor 505 are connected, so that the channel formation region formed in the oxide 530 can be covered.

That is, the channel formation region can be electrically surrounded by the electric field of the conductor 560 having a function of the first gate electrode and the electric field of the conductor 505 having a function of the second gate electrode. In other words, the transistor 510A has a surrounded channel (S-channel) structure, like the transistor 500 described above.

Like the insulator 511 or the insulator 512, the insulator 514 and the insulator 516 each function as an interlayer film. For example, the insulator 514 preferably functions as a barrier film that inhibits entry of impurities such as water or hydrogen into the transistor 510A from the substrate side. This structure can inhibit diffusion of impurities such as hydrogen and water to the transistor 510A side from the substrate side through the insulator 514. Moreover, for example, the insulator 516 preferably has a lower permittivity than the insulator 514. When a material with a low permittivity is used for the interlayer film, the parasitic capacitance generated between wirings can be reduced.

In the conductor 505 functioning as the second gate, the conductor 505a is formed in contact with an inner wall of an opening in the insulator 514 and the insulator 516, and the conductor 505b is formed further inside. Here, the top surfaces of the conductor 505a and the conductor 505b and the top surface of the insulator 516 can be substantially level with each other. Although the transistor 510A having a structure in which the conductor 505a and the conductor 505b are stacked is illustrated, the present invention is not limited thereto. For example, the conductor 505 may have a single-layer structure or a stacked-layer structure of three or more layers.

Here, for the conductor 505a, it is preferable to use a conductive material that has a function of inhibiting diffusion of impurities such as a hydrogen atom, a hydrogen molecule, a water molecule, and a copper atom (through which the above impurities are less likely to pass). Alternatively, it is preferable to use a conductive material that has a function of inhibiting diffusion of oxygen (e.g., at least one of an oxygen atom, an oxygen molecule, and the like) (through which the above oxygen is less likely to pass). Note that in this specification and the like, a function of inhibiting diffusion of impurities or oxygen means a function of inhibiting diffusion of any one or all of the above impurities and the above oxygen.

For example, when the conductor 505a has a function of inhibiting diffusion of oxygen, a reduction in conductivity of the conductor 505b due to oxidation can be inhibited.

In the case where the conductor 505 doubles as a wiring, the conductor 505b is preferably formed using a conductive material that has high conductivity and contains tungsten, copper, or aluminum as its main component. In that case, the conductor 503 is not necessarily provided. Note that the conductor 505b is illustrated as a single layer but may have a stacked-layer structure, for example, a stack of any of the above conductive materials and titanium or titanium nitride.

The insulator 521, the insulator 522, and the insulator 524 each have a function of a second gate insulating film.

The insulator 522 preferably has a barrier property. The insulator 522 having a barrier property functions as a layer that inhibits entry of impurities such as hydrogen into the transistor 510A from the surroundings of the transistor 510A.

For the insulator 522, a single layer or stacked layers of an insulator containing what is called a high-k material, such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST), are preferably used, for example. With miniaturization and high integration of transistors, a problem such as leakage current may arise because of a thinner gate insulating film. When a high-k material is used for the insulator functioning as the gate insulating film, a gate potential at the time when the transistor operates can be reduced while the physical thickness is maintained.

It is preferable that the insulator 521 be thermally stable. For example, silicon oxide and silicon oxynitride, which have thermal stability, are preferable. In addition, a combination of an insulator of a high-k material and silicon oxide or silicon oxynitride allows the insulator 521 to have a stacked-layer structure with thermal stability and a high dielectric constant.

Note that the second gate insulating film is shown to have a stacked-layer structure of three layers in FIG. 8, but may have a stacked-layer structure of two or less layers or four or more layers. In such cases, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the above-described oxide semiconductor, which is one type of metal oxide, can be used.

Note that the oxide 530c is preferably provided in the opening portion provided in the insulator 580 with the insulator 574 therebetween. When the insulator 574 has a barrier property, diffusion of impurities from the insulator 580 into the oxide 530 can be inhibited.

One of the conductors 542 functions as a source electrode and the other functions as a drain electrode.

For the conductor 542a and the conductor 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and high oxidation resistance.

In addition, although a single-layer structure is illustrated in FIG. 8, a stacked-layer structure of two or more layers may also be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

A barrier layer may be provided over the conductor 542. The barrier layer is preferably formed using a substance having a barrier property against oxygen or hydrogen. This structure can inhibit oxidation of the conductor 542 at the time of depositing the insulator 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductor 542 can be expanded. For example, a material having a low oxidation resistance and high conductivity, such as tungsten or aluminum, can be used for the conductor 542. Moreover, for example, a conductor that can be easily deposited or processed can be used.

The insulator 550 functions as a first gate insulating film. The insulator 550 is preferably provided in the opening portion provided in the insulator 580 with the oxide 530c and the insulator 574 therebetween.

With miniaturization and high integration of transistors, a problem such as leakage current may arise because of a thinner gate insulating film. In that case, the insulator 550 may have a stacked-layer structure like the second gate insulating film. When the insulator functioning as the gate insulating film has a stacked-layer structure of a high-k material and a thermally stable material, a gate potential at the time when the transistor operates can be reduced while the physical thickness is maintained. Furthermore, the stacked-layer structure can be thermally stable and have a high dielectric constant.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

As a conductive material having a function of inhibiting diffusion of oxygen, tantalum, tantalum nitride, ruthenium, or ruthenium oxide is preferably used, for example. For the conductor 560a, the oxide semiconductor that can be used as the oxide 530 can be used. In that case, when the conductor 560b is deposited by a sputtering method, the conductor 560a can have a reduced electric resistance to be a conductor. This can be referred to as an OC (Oxide Conductor) electrode.

The conductor 560b is preferably formed using a conductive material containing tungsten, copper, or aluminum as its main component. In addition, since the conductor 560 functions as a wiring, a conductor having high conductivity is preferably used as the conductor 560b. For example, a conductive material containing tungsten, copper, or aluminum as its main component can be used. The conductor 560b may have a stacked-layer structure, for example, a stack of any of the above conductive materials and titanium or titanium nitride.

The insulator 574 is positioned between the insulator 580 and the transistor 510A. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit diffusion of impurities such as water and hydrogen contained in the insulator 580 into the oxide 530b through the oxide 530c and the insulator 550. Furthermore, oxidation of the conductor 560 due to excess oxygen contained in the insulator 580 can be inhibited.

The insulator 580, the insulator 582, and the insulator 584 each function as an interlayer film.

Like the insulator 514, the insulator 582 preferably functions as a barrier insulating film that inhibits entry of impurities such as water or hydrogen into the transistor 510A from the outside.

Like the insulator 516, the insulator 580 and the insulator 584 preferably have a lower permittivity than the insulator 582. When a material with a low permittivity is used for the interlayer film, the parasitic capacitance generated between wirings can be reduced.

The transistor 510A may be electrically connected to another component through a plug or a wiring such as the conductor 546 embedded in the insulator 580, the insulator 582, and the insulator 584.

As a material for the conductor 546, a single layer or stacked layers of a conductive material such as a metal material, an alloy material, a metal nitride material, or a metal oxide material can be used, as in the case of the conductor 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductor 546 has a stacked-layer structure of tantalum nitride or the like, which is a conductor having a barrier property against hydrogen and oxygen, and tungsten, which has high conductivity, diffusion of impurities from the outside can be inhibited while the conductivity of the wiring is maintained.

With the above structure, a transistor that includes an oxide semiconductor and has a high on-state current can be provided. Alternatively, a transistor including an oxide semiconductor and having a low off-state current can be provided. Alternatively, in a semiconductor device using a transistor including an oxide semiconductor, variations in electrical characteristics can be suppressed and the reliability can be improved.

<Structure Example 2 of Transistor>

Figures 9A, 9B, 9C:
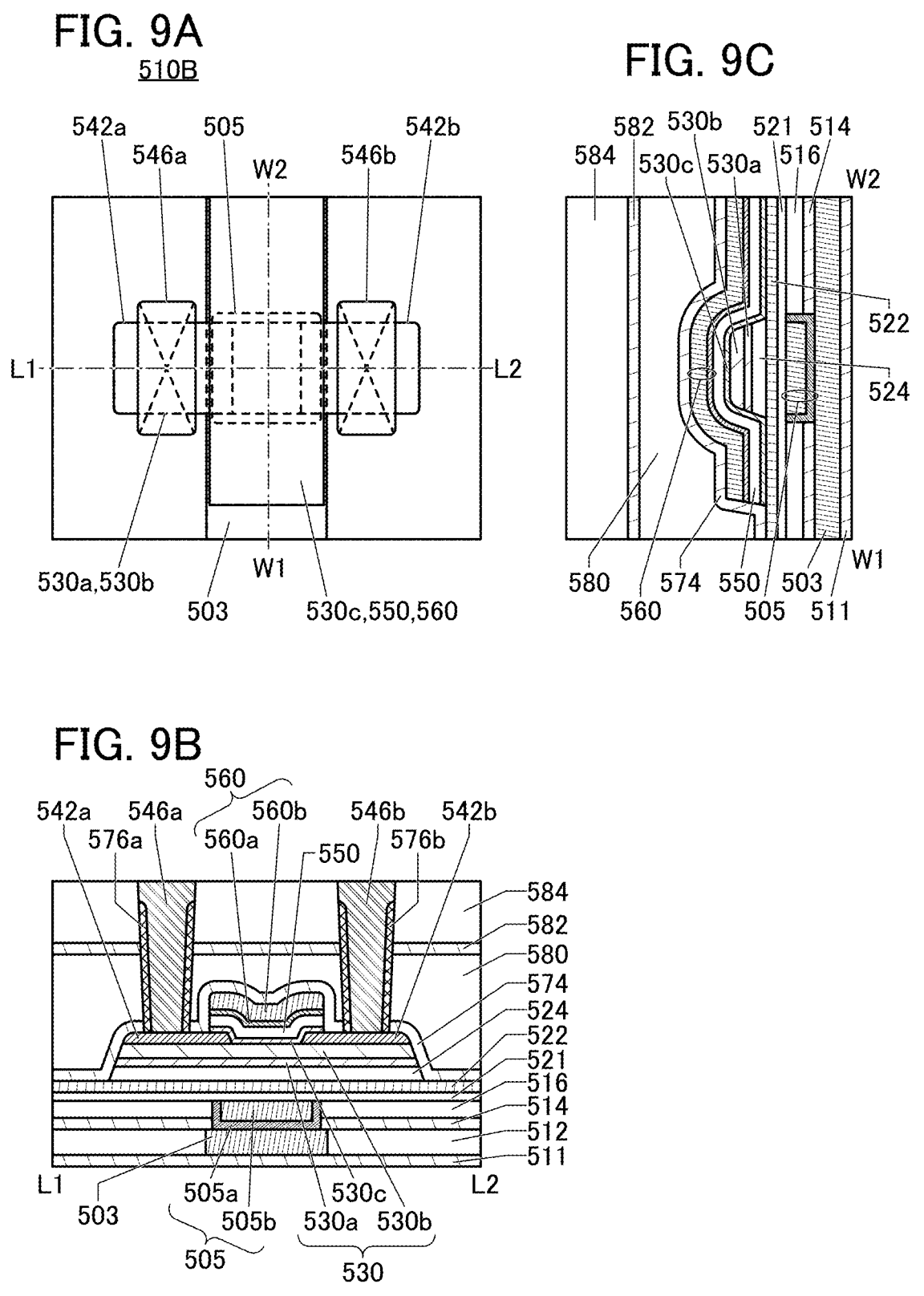

A structure example of a transistor 510B is described with reference to FIG. 9A, FIG. 9B, and FIG. 9C. FIG. 9A is a top view of the transistor 510B. FIG. 9B is a cross-sectional view of a portion indicated by a dashed-dotted line L1-L2 in FIG. 9A. FIG. 9C is a cross-sectional view of a portion indicated by a dashed-dotted line W1-W2 in FIG. 9A. Note that for clarity of the drawing, some components are not illustrated in the top view of FIG. 9A.

The transistor 510B is a modification example of the transistor 510A. Therefore, differences from the transistor 510A will be mainly described to avoid repeated description.

The transistor 510B includes a region where the oxide 530c, the insulator 550, and the conductor 560 overlap the conductor 542 (the conductor 542a and the conductor 542b). With this structure, a transistor having a high on-state current can be provided. Moreover, a transistor having high controllability can be provided.

The conductor 560 functioning as the first gate electrode includes the conductor 560a and the conductor 560b over the conductor 560a. Like the conductor 505a, the conductor 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 560a has a function of inhibiting oxygen diffusion, the range of choices for the material of the conductor 560b can be expanded. That is, the conductor 560a inhibits oxidation of the conductor 560b, thereby preventing the decrease in conductivity.

The insulator 574 is preferably provided to cover the top surface and a side surface of the conductor 560, a side surface of the insulator 550, and a side surface of the oxide 530c. For the insulator 574, an insulating material having a function of inhibiting diffusion of oxygen and impurities such as water or hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulator 574 can inhibit oxidation of the conductor 560. Moreover, the insulator 574 can inhibit diffusion of impurities such as water and hydrogen contained in the insulator 580 into the transistor 510B.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Furthermore, with the insulator 576 having a barrier property, the range of choices for the material of the conductor used as the plug or the wiring can be expanded. The use of a metal material having an oxygen absorbing property and high conductivity for the conductor 546, for example, can provide a semiconductor device with low power consumption. Specifically, a material having a low oxidation resistance and high conductivity, such as tungsten or aluminum, can be used. Moreover, for example, a conductor that can be easily deposited or processed can be used.

<Structure Example 3 of Transistor>

A structure example of a transistor 510C is described with reference to FIG. 10A, FIG. 10B, and FIG. 10C. FIG. 10A is a top view of the transistor 510C. FIG. 10B is a cross-sectional view of a portion indicated by a dashed-dotted line L1-L2 in FIG. 10A. FIG. 10C is a cross-sectional view of a portion indicated by a dashed-dotted line W1-W2 in FIG. 10A. Note that for clarity of the drawing, some components are not illustrated in the top view of FIG. 10A.

The transistor 510C is a modification example of the transistor 510A. Therefore, differences from the transistor 510A will be mainly described to avoid repeated description.

In the transistor 510C illustrated in FIG. 10, a conductor 547a is positioned between the conductor 542a and the oxide 530b, and a conductor 547b is positioned between the conductor 542b and the oxide 530b. Here, the conductor 542a (the conductor 542b) has a region that extends beyond the top surface of the conductor 547a (the conductor 547b) and its side surface on the conductor 560 side and is in contact with the top surface of the oxide 530b. For the conductors 547, a conductor that can be used as the conductor 542 is used. It is preferable that the thickness of the conductor 547 be at least greater than that of the conductor 542.

In the transistor 510C illustrated in FIG. 10, because of the above structure, the conductor 542 can be closer to the conductor 560 than in the transistor 510A. Alternatively, the conductor 560 can overlap an end portion of the conductor 542a and an end portion of the conductor 542b. Thus, the effective channel length of the transistor 510C can be shortened, and the on-state current and the frequency characteristics can be improved.

The conductor 547a (the conductor 547b) is preferably provided to be overlapped by the conductor 542a (the conductor 542b). With such a structure, the conductor 547a (the conductor 547b) can function as a stopper to prevent over-etching of the oxide 530b in etching for forming the opening in which the conductor 546a (the conductor 546b) is to be embedded.

The transistor 510C illustrated in FIG. 10 may have a structure in which an insulator 545 is positioned over and in contact with the insulator 544. The insulator 544 preferably functions as a barrier insulating film that inhibits entry of impurities such as water or hydrogen and excess oxygen into the transistor 510C from the insulator 580 side. The insulator 545 can be formed using an insulator that can be used for the insulator 544. In addition, the insulator 544 may be formed using a nitride insulator such as aluminum nitride, aluminum titanium nitride, titanium nitride, silicon nitride, or silicon nitride oxide, for example.

Unlike in the transistor 510A illustrated in FIG. 8, in the transistor 510C illustrated in FIG. 10, a structure where the conductor 505 has a single-layer structure may be employed. In this case, an insulating film to be the insulator 516 is formed over the patterned conductor 505, and an upper portion of the insulating film is removed by a CMP method or the like until the top surface of the conductor 505 is exposed. Preferably, the planarity of the top surface of the conductor 505 is made favorable. For example, the average surface roughness (Ra) of the top surface of the conductor 505 is less than or equal to 1 nm, preferably less than or equal to 0.5 nm, further preferably less than or equal to 0.3 nm. This allows the improvement in planarity of an insulating layer formed over the conductor 505 and the increase in crystallinity of the oxide 530b and the oxide 530c.

<Structure Example 4 of Transistor>

A structure example of a transistor 510D is described with reference to FIG. 11A, FIG. 11B, and FIG. 11C. FIG. 11A is a top view of the transistor 510D. FIG. 11B is a cross-sectional view of a portion indicated by a dashed-dotted line L1-L2 in FIG. 11A. FIG. 11C is a cross-sectional view of a portion indicated by a dashed-dotted line W1-W2 in FIG. 11A. Note that for clarity of the drawing, some components are not illustrated in the top view in FIG. 11A.

The transistor 510D is a modification example of the above transistors. Therefore, differences from the above transistors will be mainly described to avoid repeated description.

In FIG. 11A to FIG. 11C, the conductor 503 is not provided, and the conductor 505 that has a function of a second gate is made to function also as a wiring. In addition, the insulator 550 is provided over the oxide 530c and a metal oxide 552 is provided over the insulator 550. In addition, the conductor 560 is provided over the metal oxide 552, and an insulator 570 is provided over the conductor 560. Furthermore, an insulator 571 is provided over the insulator 570.

The metal oxide 552 preferably has a function of inhibiting diffusion of oxygen. When the metal oxide 552 that inhibits oxygen diffusion is provided between the insulator 550 and the conductor 560, diffusion of oxygen into the conductor 560 is inhibited. That is, a reduction in the amount of oxygen supplied to the oxide 530 can be inhibited. Moreover, oxidation of the conductor 560 due to oxygen can be inhibited.

Note that the metal oxide 552 may have a function of part of the first gate. For example, the oxide semiconductor that can be used for the oxide 530 can be used for the metal oxide 552. In this case, when the conductor 560 is deposited by a sputtering method, the electrical resistance of the metal oxide 552 is lowered so that the metal oxide 552 can be a conductive layer. This can be referred to as an OC (Oxide Conductor) electrode.

The metal oxide 552 may have a function of part of a gate insulating film. Thus, when silicon oxide, silicon oxynitride, or the like is used for the insulator 550, a metal oxide that is a high-k material with a high dielectric constant is preferably used for the metal oxide 552. Such a stacked-layer structure can be thermally stable and can have a high dielectric constant. Thus, a gate potential that is applied when the transistor operates can be lowered while the physical thickness is maintained. In addition, the equivalent oxide thickness (EOT) of an insulating layer functioning as the gate insulating film can be reduced.

Although the metal oxide 552 in the transistor 510D is shown as a single layer, the metal oxide 552 may have a stacked-layer structure of two or more layers. For example, a metal oxide functioning as part of the gate electrode and a metal oxide functioning as part of the gate insulating film may be stacked.

With the metal oxide 552 functioning as a gate electrode, the on-state current of the transistor 510D can be increased without a reduction in the influence of the electric field from the conductor 560. With the metal oxide 552 functioning as the gate insulating film, the distance between the conductor 560 and the oxide 530 is kept by the physical thicknesses of the insulator 550 and the metal oxide 552, so that leakage current between the conductor 560 and the oxide 530 can be reduced. Thus, with the stacked-layer structure of the insulator 550 and the metal oxide 552, the physical distance between the conductor 560 and the oxide 530 and the intensity of electric field applied from the conductor 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential component. Design is appropriately set in consideration of required transistor characteristics.

For the insulator 570, an insulating material having a function of inhibiting the passage of oxygen and impurities such as water and hydrogen is preferably used. For example, aluminum oxide or hafnium oxide is preferably used. Thus, oxidation of the conductor 560 due to oxygen from above the insulator 570 can be inhibited. Moreover, entry of impurities such as water or hydrogen from above the insulator 570 into the oxide 530 through the conductor 560 and the insulator 550 can be inhibited.

The insulator 571 functions as a hard mask. By providing the insulator 571, the conductor 560 can be processed to have a side surface that is substantially vertical; specifically, an angle formed by the side surface of the conductor 560 and a substrate surface can be greater than or equal to 75° and less than or equal to 100°, preferably greater than or equal to 80° and less than or equal to 95°.

Note that an insulating material having a function of inhibiting the passage of oxygen and impurities such as water or hydrogen may be used for the insulator 571 so that the insulator 571 also functions as a barrier layer. In that case, the insulator 570 does not have to be provided.

Parts of the insulator 570, the conductor 560, the metal oxide 552, the insulator 550, and the oxide 530c are selected and removed using the insulator 571 as a hard mask, whereby their side surfaces can be substantially aligned with each other and a surface of the oxide 530b can be partly exposed.

The transistor 510D includes a region 531a and a region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such a manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to as "impurity regions" or "low-resistance regions".

The region 531a and the region 531b can be formed in a self-aligned manner by using the insulator 571 and/or the conductor 560 as a mask. Thus, the conductor 560 does not overlap the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and the impurity element is not added. The offset region can be formed by the addition of the impurity element after the formation of an insulator 575. In this case, the insulator 575 serves as a mask like the insulator 571 or the like. Thus, the impurity element is not added to a region of the oxide 530b overlapped by the insulator 575, so that the electrical resistivity of the region can be kept high.

The transistor 510D includes the insulator 575 on the side surfaces of the insulator 570, the conductor 560, the metal oxide 552, the insulator 550, and the oxide 530c. The insulator 575 is preferably an insulator having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulator 575, in which case an excess-oxygen region can be easily formed in the insulator 575 in a later step. Silicon oxide and silicon oxynitride are preferable because of their thermal stability. The insulator 575 preferably has a function of diffusing oxygen.

The transistor 510D also includes the insulator 574 over the insulator 575 and the oxide 530. The insulator 574 is preferably deposited by a sputtering method. When a sputtering method is used, an insulator containing few impurities such as water or hydrogen can be deposited. For example, aluminum oxide is preferably used for the insulator 574.

Note that an oxide film obtained by a sputtering method may extract hydrogen from the component over which the oxide film is deposited. Thus, the hydrogen concentration in the oxide 530 and the insulator 575 can be reduced when the insulator 574 absorbs hydrogen and water from the oxide 530 and the insulator 575.

<Structure Example 5 of Transistor>

A structure example of a transistor 510E is described with reference to FIG. 12A to FIG. 12C. FIG. 12A is a top view of the transistor 510E. FIG. 12B is a cross-sectional view of a portion indicated by the dashed-dotted line L1-L2 in FIG. 12A. FIG. 12C is a cross-sectional view of a portion indicated by the dashed-dotted line W1-W2 in FIG. 12A. Note that for clarity of the drawing, some components are not illustrated in the top view in FIG. 12A.

The transistor 510E is a modification example of the above transistors. Therefore, differences from the above transistors will be mainly described to avoid repeated description.

In FIG. 12A to FIG. 12C, the conductor 542 is not provided, and part of the exposed surface of the oxide 530b includes the region 531a and the region 531b. One of the region 531a and the region 531b functions as a source region, and the other functions as a drain region. Moreover, an insulator 573 is included between the oxide 530b and the insulator 574.

The regions 531 (the region 531a and the region 531b) illustrated in FIG. 12 are regions where an element described below is added to the oxide 530b. The regions 531 can be formed using a dummy gate, for example.

Specifically, a dummy gate is provided over the oxide 530b, and the element that reduces the resistance of the oxide 530b is added using the dummy gate as a mask. That is, the element is added to regions of the oxide 530 that are not overlapped by the dummy gate, whereby the regions 531 are formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas, or the like may be used. Typical examples of the rare gas include helium, neon, argon, krypton, and xenon. The concentration of the element is measured by secondary ion mass spectrometry (SIMS) or the like.

In particular, boron and phosphorus are preferable because an apparatus used in a manufacturing line for low-temperature polysilicon can be used, for example. Since the existing facility can be used, capital investment can be reduced.

Next, an insulating film to be the insulator 573 and an insulating film to be the insulator 574 may be formed over the oxide 530b and the dummy gate. Stacking the insulating film to be the insulator 573 and the insulating film to be the insulator 574 can provide a region where the oxide 530c and the insulator 550 overlap the region 531.

Specifically, after an insulating film to be the insulator 580 is provided over the insulating film to be the insulator 574, the insulating film to be the insulator 580 is subjected to CMP (Chemical Mechanical Polishing) treatment, whereby part of the insulating film to be the insulator 580 is removed and the dummy gate is exposed. Then, when the dummy gate is removed, part of the insulator 573 in contact with the dummy gate is preferably also removed. Thus, the insulator 574 and the insulator 573 are exposed at a side surface of an opening portion provided in the insulator 580, and the region 531 provided in the oxide 530b is partly exposed at the bottom surface of the opening portion. Next, an oxide film to be the oxide 530c, an insulating film to be the insulator 550, and a conductive film to be the conductor 560 are formed in this order in the opening portion, and then the oxide film to be the oxide 530c, the insulating film to be the insulator 550, and the conductive film to be the conductor 560 are partly removed by CMP treatment or the like until the insulator 580 is exposed; thus, the transistor illustrated in FIG. 12 can be formed.

Note that the insulator 573 and the insulator 574 are not essential components. Design is appropriately set in consideration of required transistor characteristics.

The cost of the transistor illustrated in FIG. 12 can be reduced because an existing apparatus can be used and the conductor 542 is not provided.

<Structure Example 6 of Transistor>

Figures 13A, 13B, 13C:
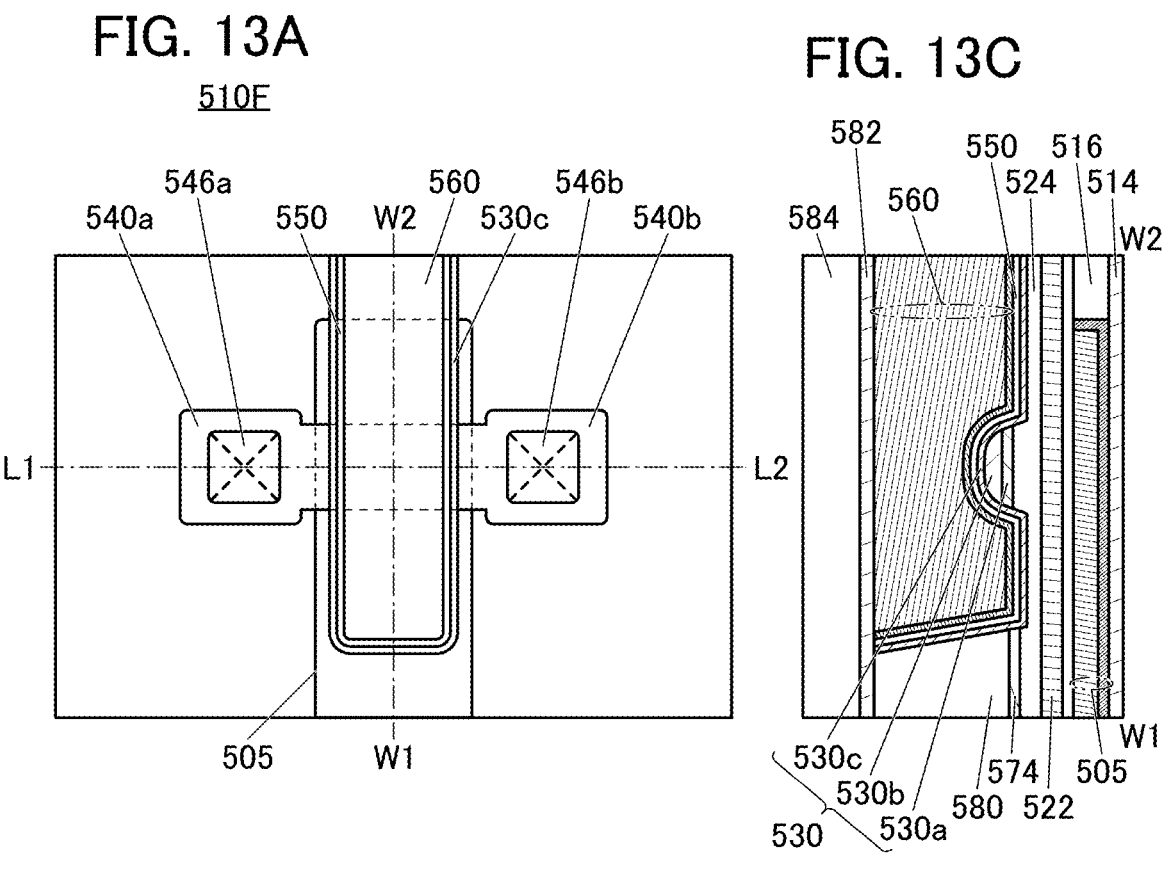
FIG. 13A is a top view illustrating a structure example of a transistor.
FIG. 13B and FIG. 13C are cross-sectional views illustrating the structure example of the transistor.

A structure example of a transistor 510F is described with reference to FIG. 13A to FIG. 13C. FIG. 13A is a top view of the transistor 510F. FIG. 13B is a cross-sectional view of a portion indicated by a dashed-dotted line L1-L2 in FIG. 13A. FIG. 13C is a cross-sectional view of a portion indicated by a dashed-dotted line W1-W2 in FIG. 13A. Note that for clarity of the drawing, some components are not illustrated in the top view in FIG. 13A.

The transistor 510F is a modification example of the transistor 510A. Therefore, differences from the above transistors will be mainly described to avoid repeated description.

In the transistor 510A, part of the insulator 574 is provided in the opening portion provided in the insulator 580 and covers the side surface of the conductor 560. Meanwhile, in the transistor 510F, an opening is formed by partly removing the insulator 580 and the insulator 574.

An insulator 576 (an insulator 576a and an insulator 576b) having a barrier property may be provided between the conductor 546 and the insulator 580. Providing the insulator 576 can prevent oxygen in the insulator 580 from reacting with the conductor 546 and oxidizing the conductor 546.

Note that when an oxide semiconductor is used as the oxide 530, the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. A metal oxide that can be used as the oxide 530a or the oxide 530b can be used as the oxide 530c.

The oxide 530a, the oxide 530b, and the oxide 530c preferably have crystallinity, and in particular, it is preferable to use a CAAC-OS. An oxide having crystallinity, such as a CAAC-OS, has a dense structure with small amounts of impurities and defects (e.g., oxygen vacancies) and high crystallinity. This can inhibit extraction of oxygen from the oxide 530b by the source electrode or the drain electrode. This can reduce extraction of oxygen from the oxide 530b even when heat treatment is performed; hence, the transistor 510F is stable against high temperatures (i.e., thermal budget) in the manufacturing process.

Note that one or both of the oxide 530a and the oxide 530c may be omitted. The oxide 530 may be a single layer of the oxide 530b. In the case where the oxide 530 is a stack of the oxide 530a, the oxide 530b, and the oxide 530c, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b. In that case, for the oxide 530c, a metal oxide that can be used for the oxide 530a is preferably used. Specifically, the atomic proportion of the element M in the constituent elements in the metal oxide used as the oxide 530c is preferably higher than the atomic proportion of the element M in the constituent elements in the metal oxide used as the oxide 530b. Moreover, the atomic ratio of the element M to In in the metal oxide used as the oxide 530c is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530c.

The energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To obtain this, the density of defect states in a mixed layer formed at the interface between the oxide 530a and the oxide 530b and the interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like may be used as the oxide 530a and the oxide 530c. In addition, the oxide 530c may have a stacked-layer structure. For example, it is possible to employ a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the oxide 530c may employ a stacked-layer structure of an In—Ga—Zn oxide and an oxide that does not contain In.

Specifically, as the oxide 530a, a metal oxide with In:Ga:Zn=1:3:4 [atomic ratio] or 1:1:0.5 [atomic ratio] is used. As the oxide 530b, a metal oxide with In:Ga:Zn=4:2:3 [atomic ratio] or 3:1:2 [atomic ratio] is used. As the oxide 530c, a metal oxide with In:Ga:Zn=1:3:4 [atomic ratio], In:Ga:

Zn=4:2:3 [atomic ratio], Ga:Zn=2:1 [atomic ratio], or Ga:Zn=2:5 [atomic ratio] is used. Furthermore, specific examples of the case where the oxide 530c has a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 510F can have a high on-state current and high frequency characteristics. Note that in the case where the oxide 530c has a stacked-layer structure, in addition to the effect of reducing the density of defect states at the interface between the oxide 530b and the oxide 530c, the effect of inhibiting diffusion of the constituent element of the oxide 530c to the insulator 550 side is expected. More specifically, the oxide 530c has a stacked-layer structure and the oxide that does not contain In is positioned at the upper part of the stacked-layer structure, whereby the amount of In that would diffuse to the insulator 550 side can be reduced. Since the insulator 550 functions as a gate insulator, the transistor has defects in characteristics when In diffuses. Thus, when the oxide 530c has a stacked-layer structure, a highly reliable semiconductor device can be provided.

A metal oxide functioning as an oxide semiconductor is preferably used as the oxide 530. For example, as the metal oxide to be the channel formation region in the oxide 530, a metal oxide having a bandgap of 2 eV or larger, preferably 2.5 eV or larger is preferably used. With the use of a metal oxide having such a wide bandgap, the off-state current of the transistor can be reduced. With such a transistor, a semiconductor device with low power consumption can be provided.

<Structure Example 7 of Transistor>

A structure example of a transistor 510G is described with reference to FIG. 14A and FIG. 14B. The transistor 510G is a modification example of the transistor 500. Therefore, differences from the above transistors will be mainly described to avoid repeated description. Note that the structure illustrated in FIG. 14A and FIG. 14B can be employed for other transistors, such as the transistor 300, included in the semiconductor device of one embodiment of the present invention.

Figure 14A:
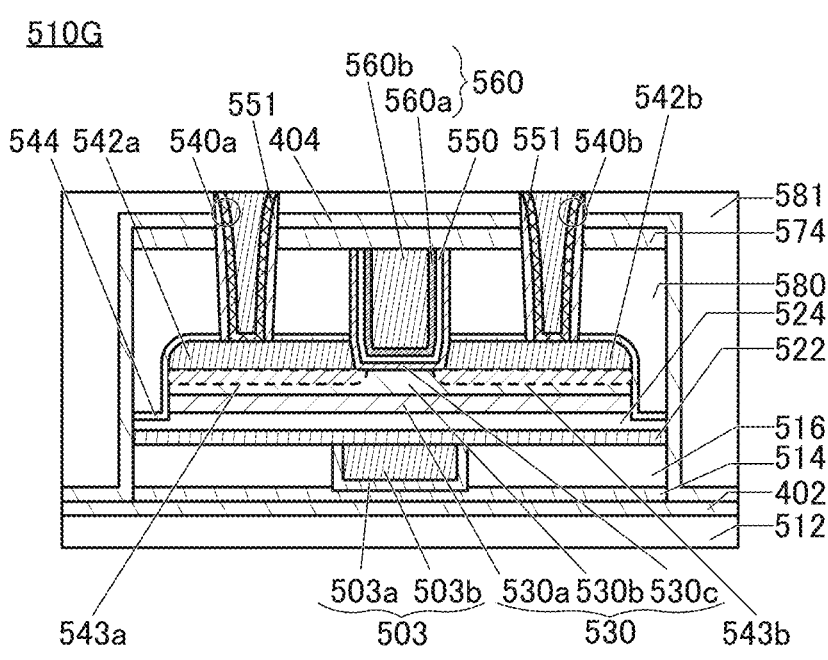
FIG. 14A and FIG. 14B are cross-sectional views illustrating a structure example of a transistor.
Figure 14B:
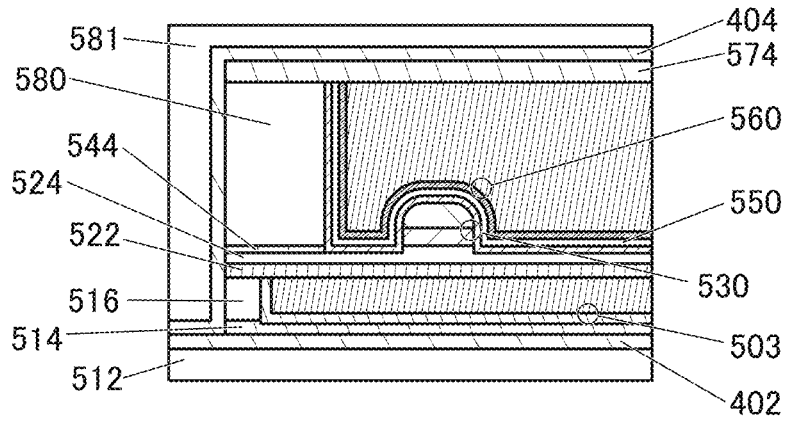

FIG. 14A is a cross-sectional view of the transistor 510G in the channel length direction, and FIG. 14B is a cross-sectional view of the transistor 510G in the channel width direction. The transistor 510G illustrated in FIG. 14A and FIG. 14B is different from the transistor 500 illustrated in FIG. 7A and FIG. 7B in including the insulator 402 and the insulator 404. Another difference from the transistor 500 illustrated in FIG. 7A and FIG. 7B is that the insulator 551 is provided in contact with a side surface of the conductor 540a and the insulator 551 is provided in contact with a side surface of the conductor 540b. Another difference from the transistor 500 illustrated in FIG. 7A and FIG. 7B is that the insulator 520 is not provided.

In the transistor 510G illustrated in FIG. 14A and FIG. 14B, the insulator 402 is provided over the insulator 512. In addition, the insulator 404 is provided over the insulator 574 and the insulator 402.

The transistor 510G illustrated in FIG. 14A and FIG. 14B has a structure in which the insulator 514, the insulator 516, the insulator 522, the insulator 524, the insulator 544, the insulator 580, and the insulator 574 are patterned and covered with the insulator 404. That is, the insulator 404 is in contact with the top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and the top surface of the insulator 402. Thus, the oxide 530 and the like are isolated from the outside by the insulator 404 and the insulator 402.

It is particularly preferable that the insulator 402 and insulator 404 have higher capability of inhibiting diffusion of hydrogen (e.g., at least one of a hydrogen atom, a hydrogen molecule, and the like) or a water molecule. For example, the insulator 402 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 510G. Consequently, the reliability of the semiconductor device of one embodiment of the present invention can be increased.

The insulator 551 is provided in contact with the insulator 581, the insulator 404, the insulator 574, the insulator 580, and the insulator 544. The insulator 551 preferably has a function of inhibiting diffusion of hydrogen or water molecules. For example, as the insulator 551, an insulator such as silicon nitride, aluminum oxide, or silicon nitride oxide that has a high hydrogen barrier property is preferably used. In particular, silicon nitride is suitably used for the insulator 551 because of its high hydrogen barrier property. The use of a material having a high hydrogen barrier property for the insulator 551 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. Consequently, the reliability of the semiconductor device of one embodiment of the present invention can be increased.

Figure 15:
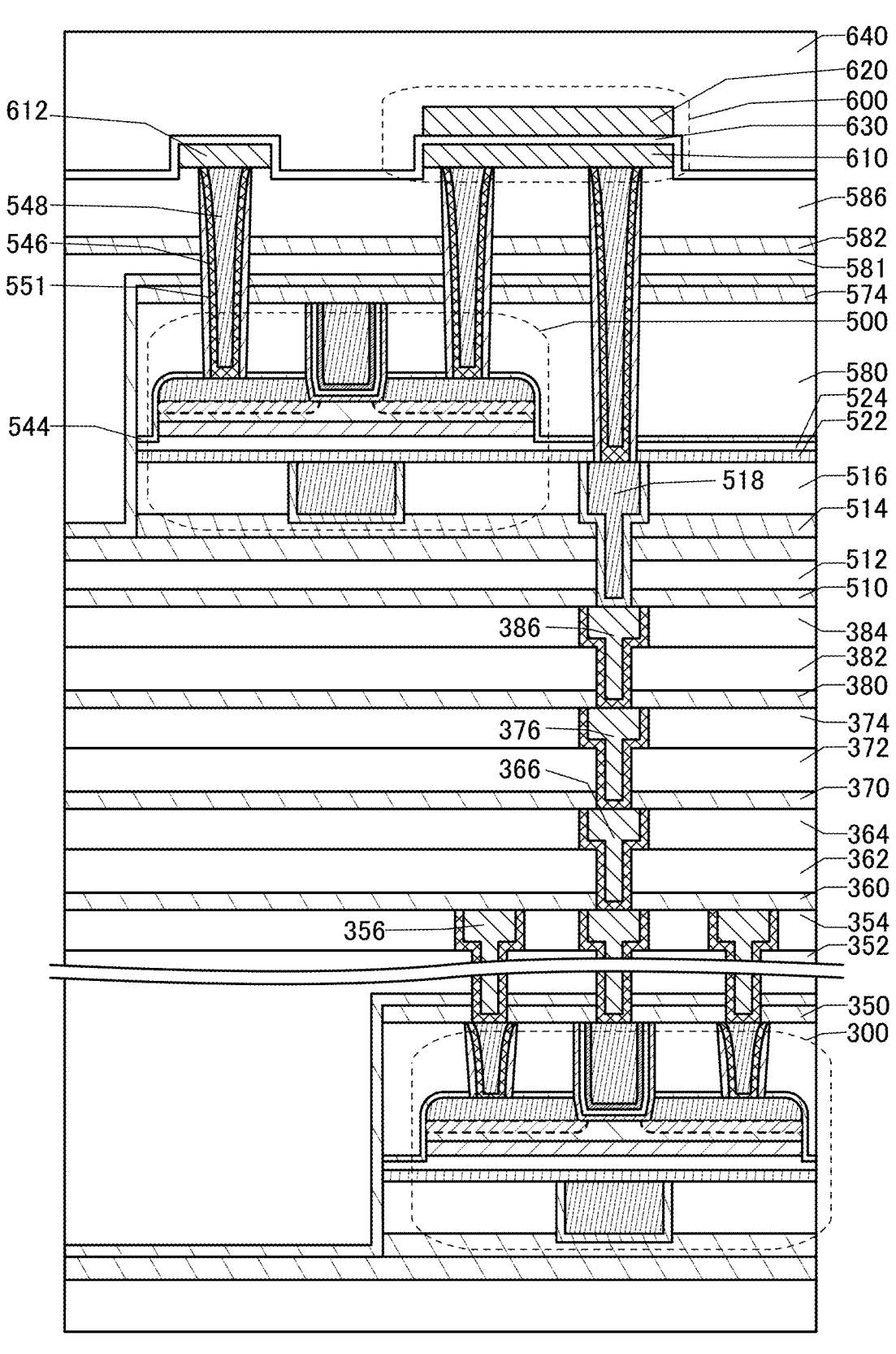
FIG. 15 is a cross-sectional view illustrating a structure example of a memory device.

FIG. 15 is a cross-sectional view illustrating a structure example of the semiconductor device in the case where the transistor 500 and the transistor 300 have the structure illustrated in FIG. 14A and FIG. 14B. The insulator 551 is provided on the side surface of the conductor 546.

Figure 16A:
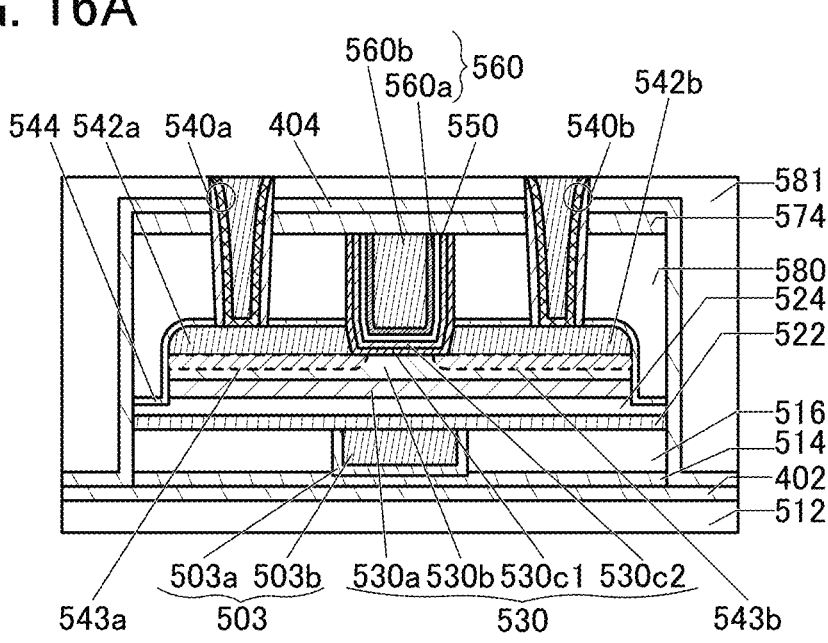
FIG. 16A and FIG. 16B are cross-sectional views illustrating a structure example of a transistor.
Figure 16B:
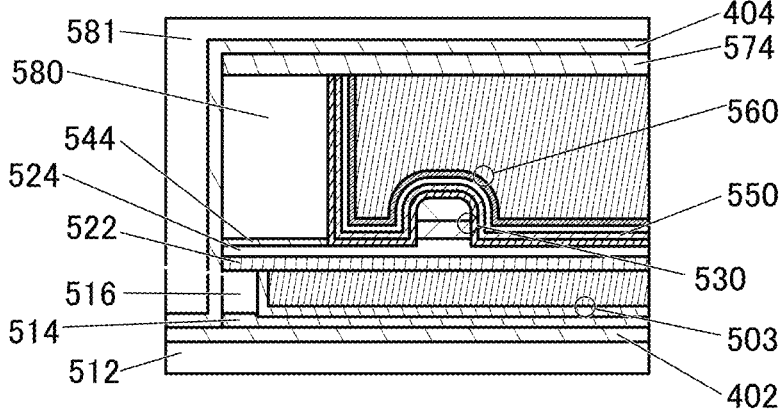

FIG. 16A and FIG. 16B shows a modification example of the transistor illustrated in FIG. 14A and FIG. 14B. FIG. 16A is a cross-sectional view of the transistor in the channel length direction, and FIG. 16B is a cross-sectional view of the transistor in the channel width direction. The transistor illustrated in FIG. 16A and FIG. 16B is different from the transistor illustrated in FIG. 14A and FIG. 14B in that the oxide 530c has a two-layer structure of an oxide 530c1 and an oxide 530c2.

The oxide 530c1 is in contact with the top surface of the insulator 524, a side surface of the oxide 530a, the top surface and a side surface of the oxide 530b, side surfaces of the conductor 542a and the conductor 542b, a side surface of the insulator 544, and a side surface of the insulator 580. The oxide 530c2 is in contact with the insulator 550.

An In—Zn oxide can be used as the oxide 530c1, for example. For the oxide 530c2, it is possible to use a material similar to the material that can be used for the oxide 530c when the oxide 530c has a single-layer structure. For example, as the oxide 530c2, a metal oxide with In:Ga:

Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, a transistor can be a power MOS transistor, for example. Note that the oxide 530c included in the transistor illustrated in FIG. 7A and FIG. 7B can also have a two-layer structure of the oxide 530c1 and the oxide 530c2.

The transistor illustrated in FIG. 16A and FIG. 16B can be employed for the transistor 500, the transistor 300, or both thereof.

Note that this embodiment can be implemented in appropriate combination with the other embodiments described in this specification.

Embodiment 3

In this embodiment, an oxide semiconductor that is a kind of metal oxide will be described.

The metal oxide preferably contains at least indium or zinc. In particular, indium and zinc are preferably contained. In addition, one or more kinds selected from aluminum, gallium, yttrium, tin, and the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.
<Classification of Crystal Structure>

Figures 17A, 17B, 17C:
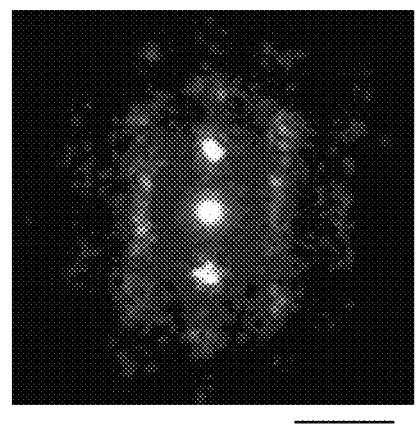
FIG. 17A is a diagram showing the classification of crystal structures of IGZO.
FIG. 17B is a graph showing an XRD spectrum of a CAAC-IGZO film.
FIG. 17C is an image showing a nanobeam electron diffraction pattern of a CAAC-IGZO film.

First, the classification of the crystal structures of an oxide semiconductor will be described with reference to FIG. 17A. FIG. 17A is a diagram showing the classification of crystal structures of an oxide semiconductor, typically IGZO (a metal oxide containing In, Ga, and Zn).

As shown in FIG. 17A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 17A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 17B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 17B and obtained by GIXD measurement is hereinafter simply referred to as an XRD spectrum. The CAAC-IGZO film in FIG. 17B has a composition in the vicinity of In:Ga:Zn=4:2:3 [atomic ratio]. The CAAC-IGZO film in FIG. 17B has a thickness of 500 nm.

In FIG. 17B, the horizontal axis represents 2θ [deg.], and the vertical axis represents intensity [a.u.]. As shown in FIG. 17B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 17B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 17C shows a diffraction pattern of the CAAC-IGZO film. FIG. 17C shows a diffraction pattern obtained with the NBED method in which an electron beam is incident in the direction parallel to the substrate. The composition of the CAAC-IGZO film in FIG. 17C is In:Ga:Zn=4:2:3 [atomic ratio] or the neighborhood thereof. In the nanobeam electron diffraction method, electron diffraction is performed with a probe diameter of 1 nm.

As shown in FIG. 17C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 17A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$) and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^3$, yet further preferably lower than $1\times10^{10}$ cm$^3$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that the composition, structure, method, and the like described in this embodiment can be used in combination as appropriate with the compositions, structures, methods, and the like described in the other embodiments and the like.

Embodiment 4

In this embodiment, application examples of the above-described semiconductor device will be described.

[Semiconductor Wafer and Chip]

Figures 18A, 18B:
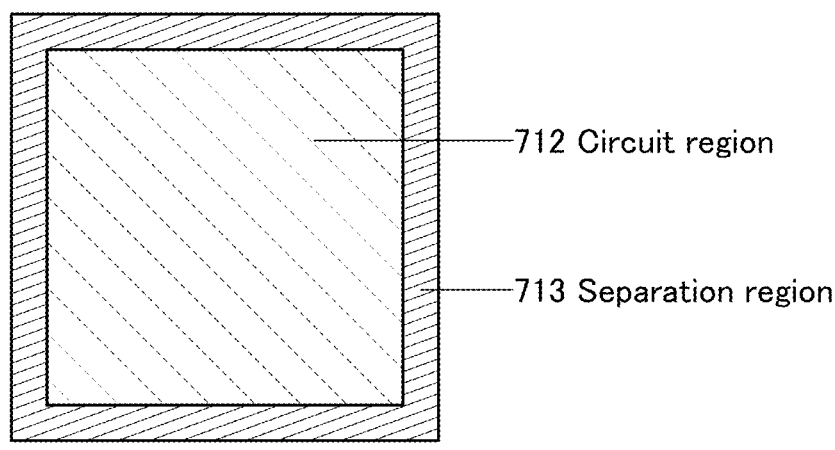
FIG. 18A is a top view of a semiconductor wafer.
FIG. 18B is a top view of a chip.

FIG. 18A is a top view of a substrate 711 before dicing treatment. As the substrate 711, a semiconductor substrate (also referred to as a semiconductor wafer) can be used, for example. A plurality of circuit regions 712 are provided over the substrate 711. A semiconductor device of one embodiment of the present invention, a CPU, an RF tag, an image sensor, or the like can be provided in the circuit region 712.

The plurality of circuit regions 712 are each surrounded by a separation region 713. Separation lines (also referred to as dicing lines) 714 are set at a position overlapping with the separation regions 713. Chips 715 each including the circuit region 712 can be cut from the substrate 711 by cutting the substrate 711 along the separation lines 714. FIG. 18B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield in the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing the semiconductor device can be reduced. Moreover, the productivity of the semiconductor device can be increased.

For a semiconductor layer provided in the separation regions 713, a material having a band gap of 2.5 eV or more and 4.2 eV or less, preferably 2.7 eV or more and 3.5 eV or less is preferably used. The use of such a material allows accumulated electric charge to be released slowly; thus, the rapid move of electric charge due to ESD can be inhibited and electrostatic breakdown is less likely to occur.

[Electronic Component]

Figure 19A:
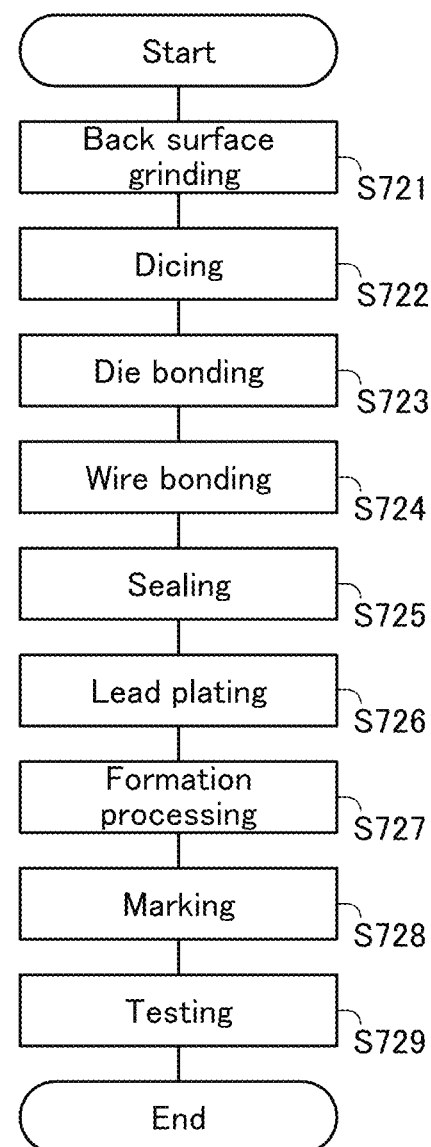
FIG. 19A is a flow chart illustrating an example of a process for manufacturing an electronic component.

An example in which the chip 715 is used for an electronic component is described with reference to FIG. 19A and FIG. 19B. Note that an electronic component is also referred to as a semiconductor package or an IC package. For electronic components, there are various standards and names corresponding to a terminal extraction direction and a terminal shape.

An electronic component is completed by combining the semiconductor device described in any of the above embodiments and components other than the semiconductor device in an assembly process (post-process).

The post-process is described with reference to a flowchart illustrated in FIG. 19A. After an element substrate including the semiconductor device described in any of the above embodiments is completed in a pre-process, a "back surface grinding step" is performed to grind a back surface (a surface where the semiconductor device and the like are not formed) of the element substrate (Step S721). When the element substrate is thinned by grinding, warpage or the like of the element substrate is reduced, resulting in the reduction in size of the electronic component.

Next, a "dicing step" is performed to divide the element substrate into a plurality of chips (the chips 715) (Step S722). Then, a "die bonding step" is performed to pick up the divided chips separately and bond them onto a lead frame (Step S723). To bond a chip and a lead frame in the die bonding step, resin bonding, tape-automated bonding, or the like is selected as appropriate depending on products. Note that the chip may be bonded to an interposer substrate instead of the lead frame.

Next, a "wire bonding step" is performed to electrically connect a lead of the lead frame and an electrode on the chip with a metal fine line (wire) (Step S724). A silver line or a gold line can be used as the metal fine line. Furthermore, ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a "lead plating step" is performed to plate the lead of the lead frame (Step S726). With the plating process, rust of the lead can be prevented, and soldering for mounting the electronic component on a printed circuit board in a later step can be performed more surely. Then, a "formation step" is performed to cut and process the lead (Step S727).

Next, a "marking step" in which printing (marking) is performed on a surface of the package is conducted (Step S728). After a "testing step" (Step S729) for checking whether an external shape is good and whether there is a malfunction, for example, the electronic component is completed.

Figure 19B:
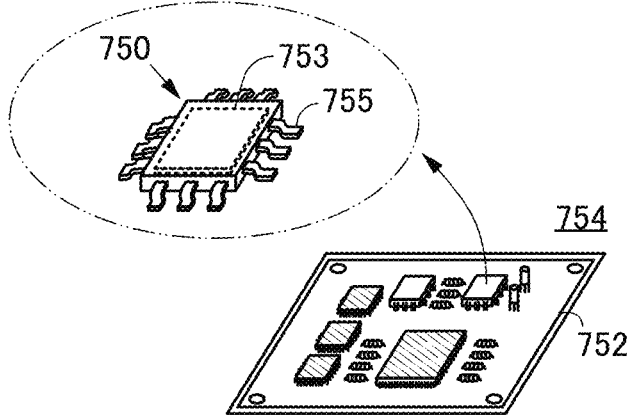
FIG. 19B is a schematic perspective view of an electronic component.

FIG. 19B is a schematic perspective view of the completed electronic component. FIG. 19B is a schematic perspective view of a QFP (Quad Flat Package) as an example of the electronic component. An electronic component 750 illustrated in FIG. 19B includes a lead 755 and a semiconductor device 753. As the semiconductor device 753, the semiconductor device described in any of the above embodiments can be used, for instance.

The electronic component 750 illustrated in FIG. 19B is, for example, mounted on a printed circuit board 752. A plurality of such electronic components 750 are combined and electrically connected to each other on the printed circuit board 752; thus, a board on which the electronic components are mounted (a circuit board 754) is completed. The completed circuit board 754 is used for an electronic device or the like.

[Electronic Device]

Examples of an electronic device including the semiconductor device 100 or the above-described electronic components of one embodiment of the present invention are described with reference to FIG. 20A, FIG. 20B, FIG. 21A, and FIG. 21B.

Figure 20A:
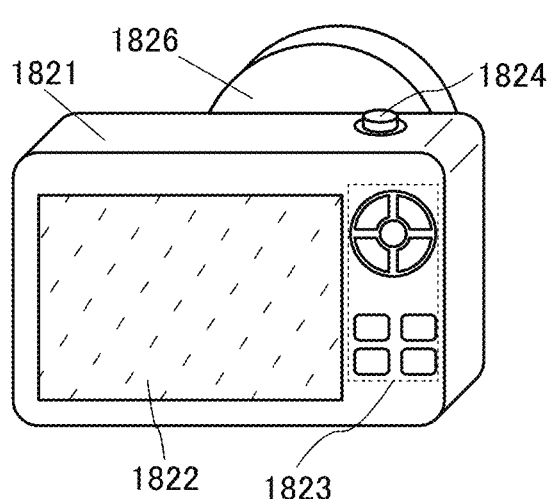
FIG. 20A and FIG. 20B are diagrams illustrating a structure of an electronic device.

FIG. 20A illustrates an example of a camera. A camera 1820 includes a housing 1821, a display portion 1822, operation buttons 1823, a shutter button 1824, and the like. The camera 1820 is provided with an attachable lens 1826.

Although the lens 1826 of the camera 1820 here is detachable from the housing 1821 for replacement, the lens 1826 may be integrated with the housing 1821.

Still images or moving images can be taken with the camera 1820 by pushing the shutter button 1824. In addition, the display portion 1822 has a function of a touch sensor, and images can be taken by a touch on the display portion 1822.

Note that a stroboscope, a viewfinder, or the like can be additionally provided in the camera 1820. Alternatively, these can be incorporated in the housing 1821.

Figure 20B:
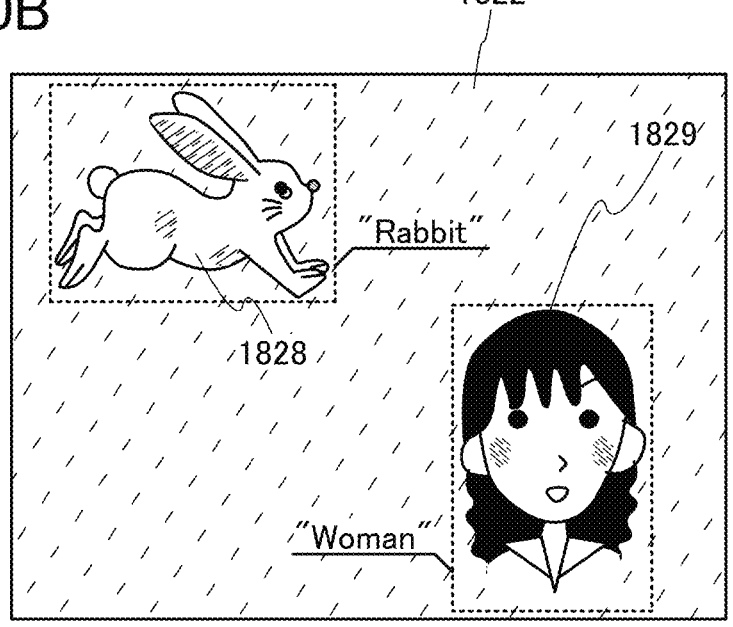

FIG. 20B is an enlarged view of the display portion 1822. The display portion 1822 can display still images or moving images that have been taken with the camera 1820 or images and the like that are being taken with the camera 1820 through the lens 1826.

A rabbit 1828 and a woman 1829 are displayed on the display portion 1822 illustrated in FIG. 20B. The semiconductor device 100 mounted in the camera 1820 performs image recognition to display frames (denoted by dotted lines in the drawing) surrounding the rabbit 1828 and the woman 1829, which distinguish the recognized objects, and can display what the objects are ("Rabbit" and "Woman" are displayed in the drawing).

Figure 21A:
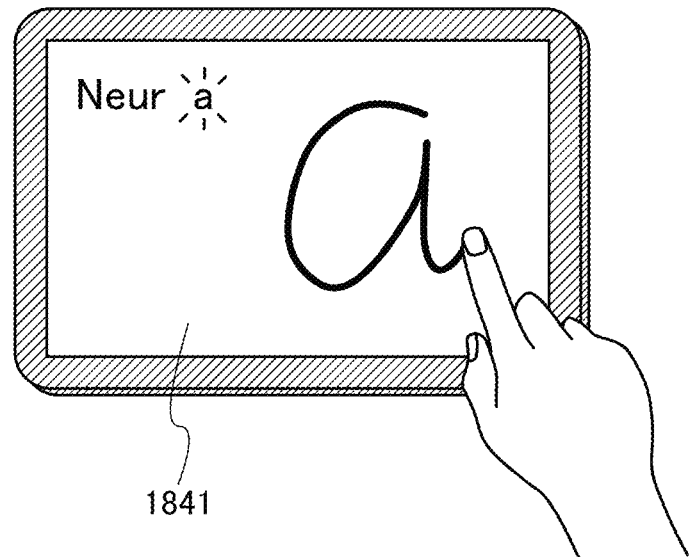
FIG. 21A and FIG. 21B are diagrams illustrating structures of electronic devices.

FIG. 21A illustrates an example of an information terminal. An information terminal 1840 includes a display portion 1841 and the like. A touch sensor is provided in the display portion 1841, and the display portion 1841 also has a function of an input portion.

The semiconductor device 100 mounted in the information terminal 1840 can recognize a letter input to the display portion 1841 and display the recognition result. FIG. 21A illustrates an example in which a user inputs an alphabet "a" with a finger, and the semiconductor device 100 recognizes the input letter and displays the recognition result on the upper left corner of the display portion 1841. Note that the input of letters in the display portion 1841 can be performed not only with the finger but also with a stylus pen or the like.

Figure 21B:
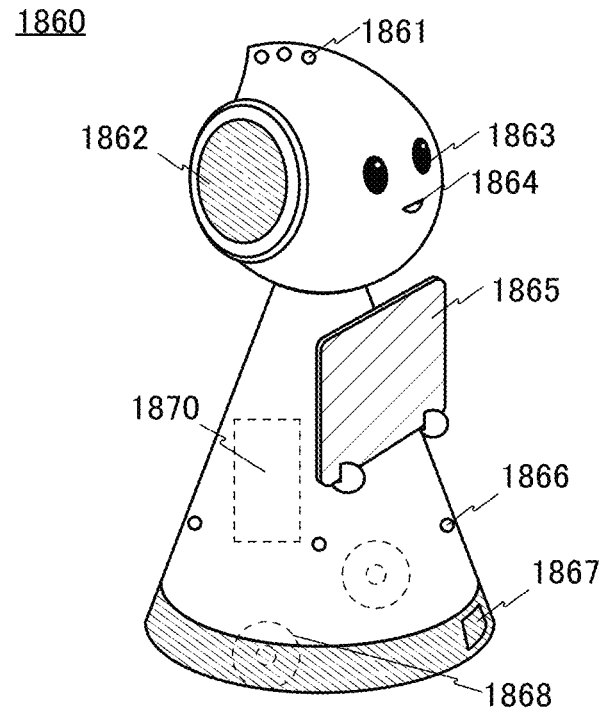

FIG. 21B illustrates an example of a robot. A robot 1860 includes an arithmetic device 1870, an illuminance sensor 1861, a microphone 1862, an upper camera 1863, a speaker 1864, a display 1865, a lower camera 1866, an obstacle sensor 1867, a moving mechanism 1868, and the like. The semiconductor device 100 is mounted in the arithmetic device 1870.

The microphone 1862 has a function of detecting a speaking voice of a user, an environmental sound, and the like. The speaker 1864 has a function of outputting sound. The robot 1860 can communicate with a user using the microphone 1862 and the speaker 1864.

The display 1865 has a function of displaying various kinds of information. The robot 1860 can display information desired by a user on the display 1865. The display 1865 may be provided with a touch sensor. Moreover, the display 1865 may be a detachable information terminal or the like, in which case charging and data communication can be performed by setting the display 1865 at the home position of the robot 1860.

The upper camera 1863 and the lower camera 1866 each have a function of capturing an image of the surroundings of the robot 1860. The obstacle sensor 1867 can detect the presence of an obstacle in the direction where the robot 1860 moves with the moving mechanism 1868.

The semiconductor device 100 mounted in the arithmetic device 1870 can analyze images captured by the upper camera 1863 and the lower camera 1866 and detect the presence of an obstacle such as a wall, furniture, a step, or a dropping object.

The semiconductor device 100 mounted in the arithmetic device 1870 can recognize the user of the robot 1860 from images captured by the upper camera 1863 and the lower camera 1866, whereby the robot 1860 can move toward the user. Furthermore, the robot 1860 can follow the user who is moving.

When the semiconductor device 100 described in the above embodiments is mounted in the electronic devices illustrated in FIG. 20A, FIG. 21A, and FIG. 21B, image recognition can be efficiently performed.

Note that this embodiment can be implemented in appropriate combination with the other embodiments described in this specification.

REFERENCE NUMERALS

A: data signal, B: data signal, BL: wiring, CX: wiring, DA: wiring, DB: wiring, DX: wiring, F: filter, MAC: circuit, MEM: circuit, N1: node, P: image data, PC: wiring, RD: wiring, REF: wiring, SUB: semiconductor substrate, VD: wiring, VDD: high power supply potential, VS: wiring, VSS: low power supply potential, W: data signal, WL: wiring, WO: wiring, WS: wiring, WT: wiring, X: data signal, 10: product-sum operation unit, 11: memory cell, 12: precharge circuit, 13: decoder circuit, 14: register circuit, 15: circuit, 16: multiplier circuit, 17: adder circuit, 18: register circuit, 21: transistor, 22: transistor, 23: transistor, 24: capacitor, 25: transistor, 41: inverter, 42: inverter, 43: inverter, 44: transistor, 45: transistor, 46: transistor, 47: transistor, 50: region, 100: semiconductor device, 101: layer, 102: layer, 111: word line driver circuit, 112: bit line driver circuit, 113: product-sum operation block, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 402: insulator, 404: insulator, 500: transistor, 503: conductor, 503a: conductor, 503b: conductor, 505: conductor, 505a: conductor, 505b: conductor, 510: insulator, 510A: transistor, 510B: transistor, 510C: transistor, 510D: transistor, 510E: transistor, 510F: transistor, 510G: transistor, 511: insulator, 512: insulator, 514: insulator, 516: insulator, 518: conductor, 520: insulator, 521: insulator, 522: insulator, 524: insulator, 530: oxide, 530a: oxide, 530b: oxide, 530c: oxide, 530c1: oxide, 530c2: oxide, 531: region, 531a: region, 531b: region, 540a: conductor, 540b: conductor, 542: conductor, 542a: conductor, 542b: conductor, 543: region, 543a: region, 543b: region, 544: insulator, 545: insulator, 546: conductor, 546a: conductor, 546b: conductor, 547: conductor, 547a: conductor, 547b: conductor, 548: conductor, 550: insulator, 551: insulator, 552: metal oxide, 560: conductor, 560a: conductor, 560b: conductor, 570: insulator, 571: insulator, 573: insulator, 574: insulator, 575: insulator, 576: insulator, 576a: insulator, 576b: insulator, 580: insulator, 581: insulator, 582: insulator, 584: insulator, 586: insulator, 600: capacitive element, 610: conductor, 612: conductor,

620: conductor, 630: insulator, 650: insulator, 711: substrate, 712: circuit region, 713: separation region, 714: separation line, 715: chip, 750: electronic component, 752: printed circuit board, 753: semiconductor device, 754: circuit board, 755: lead, 1820: camera, 1821: housing, 1822: display portion, 1823: operation button, 1824: shutter button, 1826: lens, 1829: woman, 1840: information terminal, 1841: display portion, 1860: robot, 1861: illuminance sensor, 1862: microphone, 1863: upper camera, 1864: speaker, 1865: display, 1866: lower camera, 1867: obstacle sensor, 1868: moving mechanism, 1870: arithmetic device

The invention claimed is:

1. A semiconductor device comprising a plurality of product-sum operation units, wherein the plurality of product-sum operation units each comprise a first circuit and a memory cell, wherein the first circuit comprises a first transistor on a semiconductor substrate, wherein the memory cell comprises a second transistor including a metal oxide in a channel formation region, wherein the second transistor is stacked above the first transistor, and wherein the first circuit is configured to read data stored in the memory cell and perform a product-sum operation.

2. The semiconductor device according to claim 1, wherein the metal oxide contains at least one of In and Zn.

3. An electronic component comprising the semiconductor device according to claim 1.

4. An electronic device comprising the semiconductor device according to claim 1.

5. A semiconductor device comprising:

a word line driver circuit;

a bit line driver circuit; and a product-sum operation block, wherein the product-sum operation block comprises a plurality of product-sum operation units, wherein the plurality of product-sum operation units comprise a first circuit and a memory cell, wherein the first circuit comprises a first transistor on a semiconductor substrate, wherein the memory cell comprises a second transistor including a metal oxide in a channel formation region, wherein the second transistor is stacked above the first transistor, wherein each of the word line driver circuit and the bit line driver circuit is configured to write data to the memory cell, and wherein the first circuit is configured to read data stored in the memory cell and perform a product-sum operation.

6. The semiconductor device according to claim 5, wherein the metal oxide contains at least one of In and Zn.

7. An electronic component comprising the semiconductor device according to claim 5.

8. An electronic device comprising the semiconductor device according to claim 5.

9. A semiconductor device comprising:

a word line driver circuit;

a bit line driver circuit; and a product-sum operation block, wherein the product-sum operation block comprises a plurality of product-sum operation units, wherein the plurality of product-sum operation units each comprise a first circuit and a memory cell, wherein the word line driver circuit, the bit line driver circuit, and the first circuit each comprise a first transistor on a semiconductor substrate, wherein the memory cell comprises a second transistor including a metal oxide in a channel formation region, wherein the second transistor is stacked above the first transistor, wherein each of the word line driver circuit and the bit line driver circuit is configured to write data to the memory cell, and wherein the first circuit is configured to read data stored in the memory cell and perform a product-sum operation.

10. The semiconductor device according to claim 9, wherein the metal oxide contains at least one of In and Zn.

11. An electronic component comprising the semiconductor device according to claim 9.

12. An electronic device comprising the semiconductor device according to claim 9.

* * * * *